United States Patent
Lee et al.

(10) Patent No.: US 12,432,972 B2
(45) Date of Patent: Sep. 30, 2025

(54) SEMICONDUCTOR DEVICE

(71) Applicant: SAMSUNG ELECTRONICS CO., LTD., Suwon-si (KR)

(72) Inventors: Jaehyun Lee, Hwaseong-si (KR);
Jonghan Lee, Namyangju-si (KR);
Hyungkoo Kang, Suwon-si (KR);
Jonghoon Baek, Ansan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 791 days.

(21) Appl. No.: 17/691,680

(22) Filed: Mar. 10, 2022

(65) Prior Publication Data

US 2022/0406914 A1     Dec. 22, 2022

(30) Foreign Application Priority Data

Jun. 17, 2021   (KR) .................. 10-2021-0078723

(51) Int. Cl.
| | |
|---|---|
| *H10D 30/67* | (2025.01) |
| *H10D 30/01* | (2025.01) |
| *H10D 62/10* | (2025.01) |
| *H10D 64/23* | (2025.01) |
| *H10D 64/66* | (2025.01) |

(Continued)

(52) U.S. Cl.
CPC ....... *H10D 30/6735* (2025.01); *H10D 30/019* (2025.01); *H10D 30/6757* (2025.01); *H10D 62/118* (2025.01); *H10D 62/121* (2025.01); *H10D 64/258* (2025.01);

(Continued)

(58) Field of Classification Search
CPC ............. H01L 29/4966; H01L 29/0673; H01L 29/42392; H01L 27/088; H01L 29/7831; H10D 30/501–509; H10D 30/43; H10D 30/47; H10D 30/62; H10D 30/6211; H10D 30/6217; H10D 30/6218; H10D 30/6219; H10D 30/6733; H10D 30/6734; H10D 30/6735; H10D 30/6748; H10D 30/6757; H10D 30/019; H10D 64/667; H10D 64/669; H10D 30/611
See application file for complete search history.

(56) References Cited

U.S. PATENT DOCUMENTS

| | | | |
|---|---|---|---|
| 10,170,484 B1 * | 1/2019 | Sung | ................. H01L 29/66439 |
| 10,381,490 B2 | 8/2019 | Kim et al. | |

(Continued)

*Primary Examiner* — Britt D Hanley
*Assistant Examiner* — Jason James Greaving
(74) *Attorney, Agent, or Firm* — Fish & Richardson P.C.

(57) ABSTRACT

A semiconductor device includes an active fin protruding from a substrate; a plurality of channel layers on the active fin and spaced apart from each other in a vertical direction; a gate pattern intersecting the active fin and the plurality of channel layers; and source/drain regions on recessed regions of the active fin on both sides of the gate pattern. The gate pattern includes a gate dielectric layer, inner conductive layers, and a conductive liner. The inner conductive layers are disposed between the plurality of channel layers, and between the active fin and a lowermost channel layer among the plurality of channel layers. The conductive liner has a first thickness on an upper surface of an uppermost channel layer in the vertical direction, and at least one of the inner conductive layers have a second thickness in the vertical direction. The first thickness is less than the second thickness.

18 Claims, 33 Drawing Sheets

(51) Int. Cl.
*H10D 84/83* (2025.01)
*H10D 84/85* (2025.01)

(52) U.S. Cl.
CPC .......... *H10D 64/667* (2025.01); *H10D 84/83* (2025.01); *H10D 84/851* (2025.01)

(56) References Cited

U.S. PATENT DOCUMENTS

| | | |
|---|---|---|
| 10,490,559 B1 | 11/2019 | Ando et al. |
| 10,692,873 B2 | 6/2020 | Ando et al. |
| 10,700,064 B1 | 6/2020 | Zhang et al. |
| 10,804,367 B2 | 10/2020 | Cheng et al. |
| 10,923,602 B2 | 2/2021 | Kim et al. |
| 2005/0282329 A1 | 12/2005 | Li |
| 2019/0378911 A1* | 12/2019 | Lee ................. H10D 30/43 |
| 2020/0043808 A1* | 2/2020 | Bao ................. H01L 21/28088 |
| 2020/0105752 A1* | 4/2020 | Liaw ............... H01L 21/823412 |
| 2020/0144255 A1 | 5/2020 | Lee et al. |
| 2021/0098589 A1 | 4/2021 | Cheng et al. |
| 2021/0151432 A1* | 5/2021 | Song ................ H10D 30/6757 |

\* cited by examiner

SEMICONDUCTOR DEVICE

CROSS-REFERENCE TO RELATED APPLICATION(S)

A claim of priority under 35 U.S.C. § 119 is made to Korean Patent Application No. 10-2021-0078723, filed on Jun. 17, 2021 in the Korean Intellectual Property Office, the entirety of which is hereby incorporated by.

BACKGROUND

The present disclosure relates to semiconductor devices.

As the demand for high performance, high speed, and/or multi-functionality in semiconductor devices increases, the degree of integration of semiconductor devices has also increased. During manufacture of semiconductor devices having fine patterns responsive to the trend for high integration, it is necessary to implement patterns having fine width and/or fine separation distance. In addition, effort has been made to develop semiconductor devices including FinFETs having three-dimensional channels in order to overcome the limitations of operating characteristics due to a reduction in size of a planar metal oxide semiconductor FETs (MOSFETs).

SUMMARY

Embodiments of the inventive concepts provide a semiconductor device having improved electrical characteristics and reliability.

Embodiments of the inventive concepts provide a semiconductor device including a substrate having a first region and a second region; a first active fin extending in a first direction in the first region of the substrate; a plurality of first channel layers disposed on the first active fin and spaced apart from each other in a vertical direction that is perpendicular to an upper surface of the substrate; a first gate pattern intersecting the first active fin and the plurality of first channel layers on the substrate, extending in a second direction, and surrounding at least a portion of the plurality of first channel layers; a second active fin extending in the first direction in the second region of the substrate; a plurality of second channel layers disposed on the second active fin and spaced apart from each other in the vertical direction; and a second gate pattern intersecting the second active fin and the plurality of second channel layers on the substrate, extending in the second direction, and surrounding at least a portion of the plurality of second channel layers. The first gate pattern includes a first conductive layer, a first gate dielectric layer interposed between the first conductive layer and each of the plurality of first channel layers, and a second conductive layer on the first conductive layer. The first conductive layer and the first gate dielectric layer are disposed to fill spaces between the plurality of first channel layers. The first conductive layer includes a liner portion disposed on an upper surface of an uppermost first channel layer from among the plurality of first channel layers and that has a first thickness in the vertical direction, and an inner portion disposed in the spaces between the plurality of first channel layers and that has a second thickness in the vertical direction. The first thickness is less than about 0.5 times the second thickness.

Embodiments of the inventive concept further provide a semiconductor device including an active fin protruding from a substrate and extending in a first direction; a plurality of channel layers disposed on the active fin and spaced apart from each other in a vertical direction that is perpendicular to an upper surface of the substrate; a gate pattern intersecting the active fin and the plurality of channel layers on the substrate and extending in a second direction; and source/drain regions disposed on recessed regions of the active fin on both sides of the gate pattern and connected to the plurality of channel layers. The gate pattern includes a gate dielectric layer, inner conductive layers, and a conductive liner. The inner conductive layers are disposed between the plurality of channel layers, and between the active fin and a lowermost channel layer from among the plurality of channel layers. The gate dielectric layer is disposed between each of the inner conductive layers and each of the plurality of channel layers. The inner conductive layers and the conductive liner are in direct contact with the gate dielectric layer. The conductive liner extends from the inner conductive layers onto opposite side surfaces of the plurality of channel layers in the second direction and onto an upper surface of an uppermost channel layer from among the plurality of channel layers. The conductive liner has a first thickness on the upper surface of the uppermost channel layer in the vertical direction. At least one of the inner conductive layers have a second thickness in the vertical direction, and the first thickness is less than the second thickness.

Embodiments of the inventive concepts still further provide a semiconductor device including a substrate having a first region and a second region; a first transistor disposed on the first region, and including a first active fin extending in a first direction, a plurality of first channel layers on the first active fin, a first gate pattern surrounding at least a portion of the plurality of first channel layers and extending in a second direction, and first source/drain regions disposed on the first active fin on both sides of the first gate pattern; and a second transistor disposed on the second region, and including a second active fin extending in the first direction, a plurality of second channel layers on the second active fin, a second gate pattern surrounding at least a portion of the plurality of second channel layers and extending in the second direction, and second source/drain regions disposed on the second active fin on both sides of the second gate pattern. The first transistor and the second transistor are MOSFETs having different respective conductivity types. The first gate pattern includes a first conductive layer, a first gate dielectric layer interposed between the first conductive layer and each of the plurality of first channel layers, and a second conductive layer on the first conductive layer. The second gate pattern includes a third conductive layer, a second gate dielectric layer interposed between the third conductive layer and each of the plurality of second channel layers, and a fourth conductive layer on the third conductive layer. The first conductive layer and the first gate dielectric layer are disposed to fill a space between the plurality of first channel layers, the third conductive layer, the fourth conductive layer, and the second gate dielectric layer are disposed to fill spaces between the plurality of second channel layers. The first conductive layer includes a liner portion disposed on an upper surface of an uppermost first channel layer from among the plurality of first channel layers and that has a first thickness in a vertical direction perpendicular to an upper surface of the substrate, and an inner portion disposed in the spaces between the plurality of first channel layers and that has a second thickness in the vertical direction. The first thickness is less than the second thickness.

BRIEF DESCRIPTION OF DRAWINGS

The above and other aspects, features, and advantages of the inventive concepts will be more clearly understood from the following detailed description, taken in conjunction with the accompanying drawings, in which.

DETAILED DESCRIPTION

Figure 1:
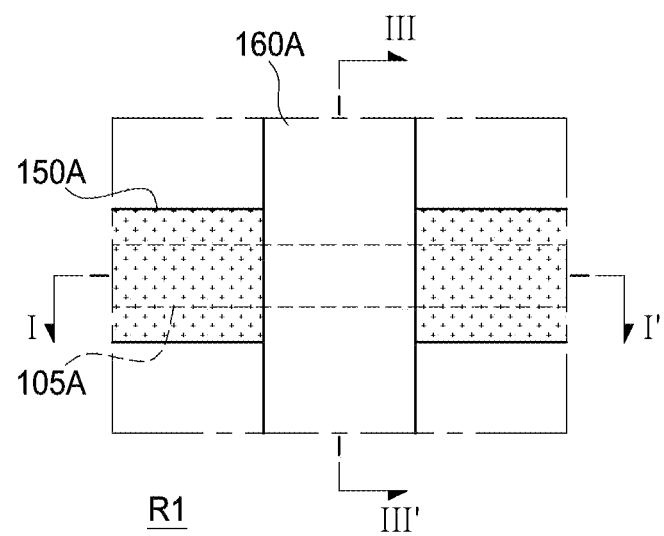
FIG. 1 illustrates a plan view schematically showing a semiconductor device according to embodiments of the inventive concepts.
Figure 1:
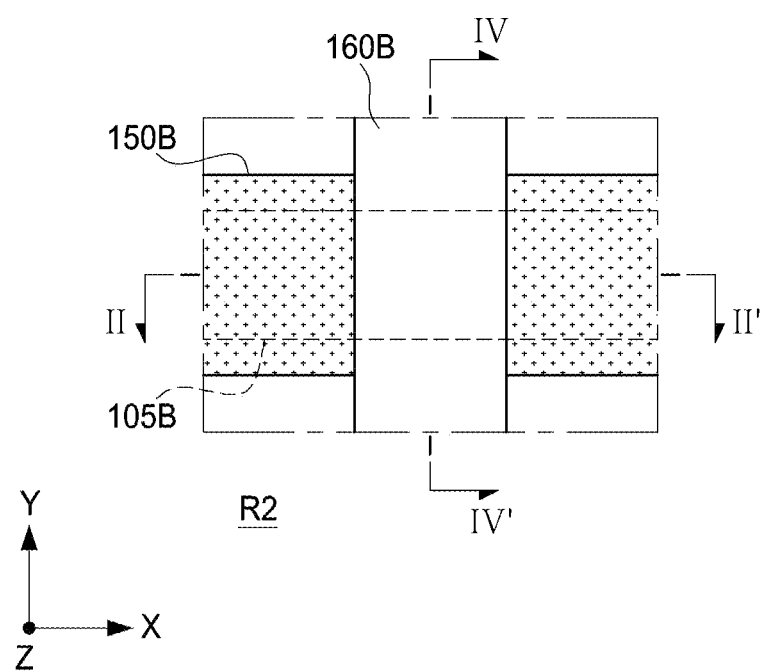

Hereinafter, preferred embodiments of the inventive concepts will be described with reference to the accompanying drawings. Herein, like reference numerals will denote like elements, and redundant descriptions thereof will be omitted for conciseness. Throughout the description, relative locations of components may be described using terms such as "vertical", "horizontal", "over", "higher" and so on. These terms are for descriptive purposes only, and are intended only to describe the relative locations of components assuming the orientation of the overall device is the same as that shown in the drawings. The embodiments however are not limited to the illustrated device orientations.

FIG. 1 illustrates a plan view schematically showing a semiconductor device according to embodiments of the inventive concepts. FIG. 1 illustrates a layout of major components of the semiconductor device.

Figure 2A:
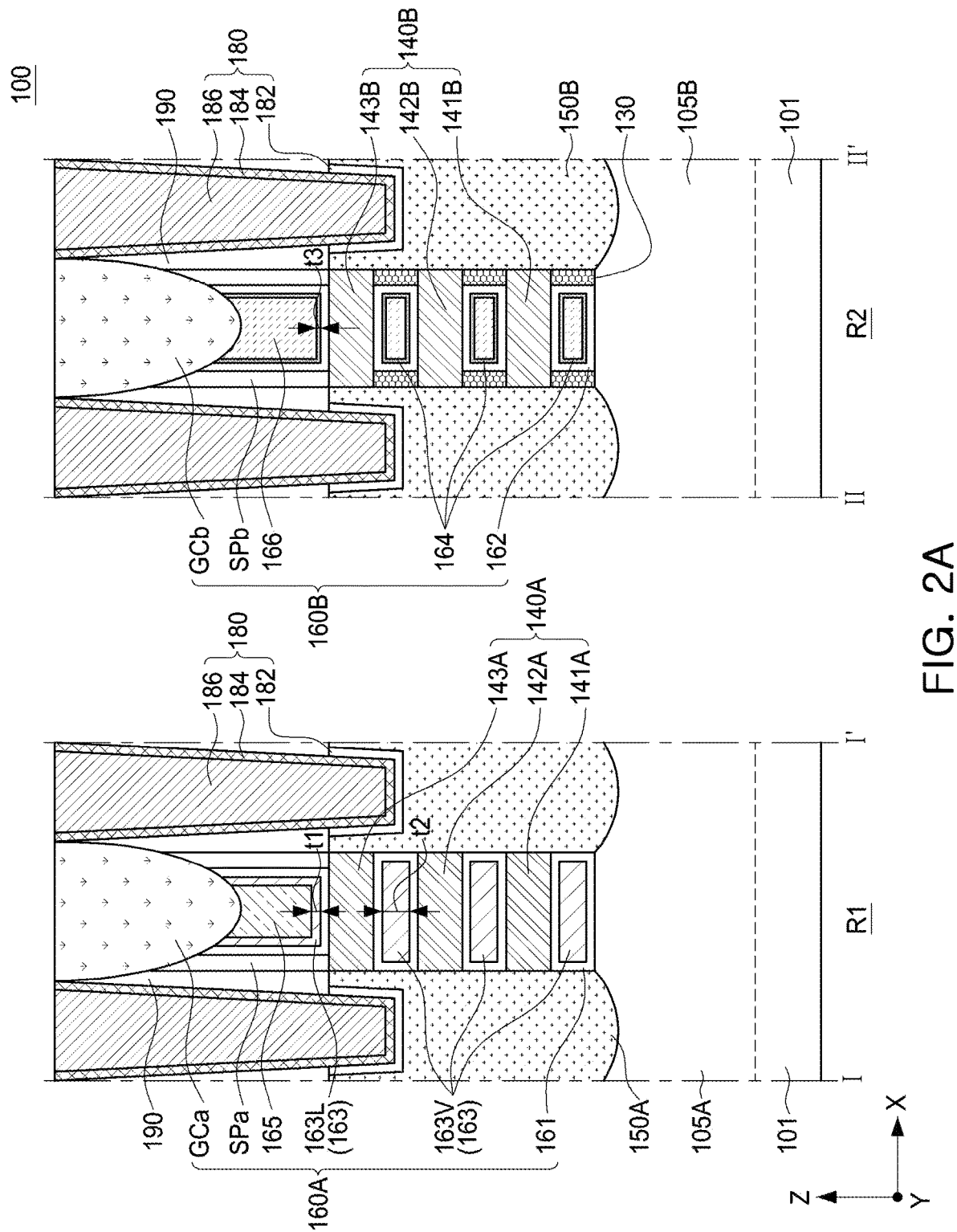
FIGS. 2A and 2B illustrate cross-sectional views schematically showing semiconductor devices according to embodiments of the inventive concepts.
Figure 2B:
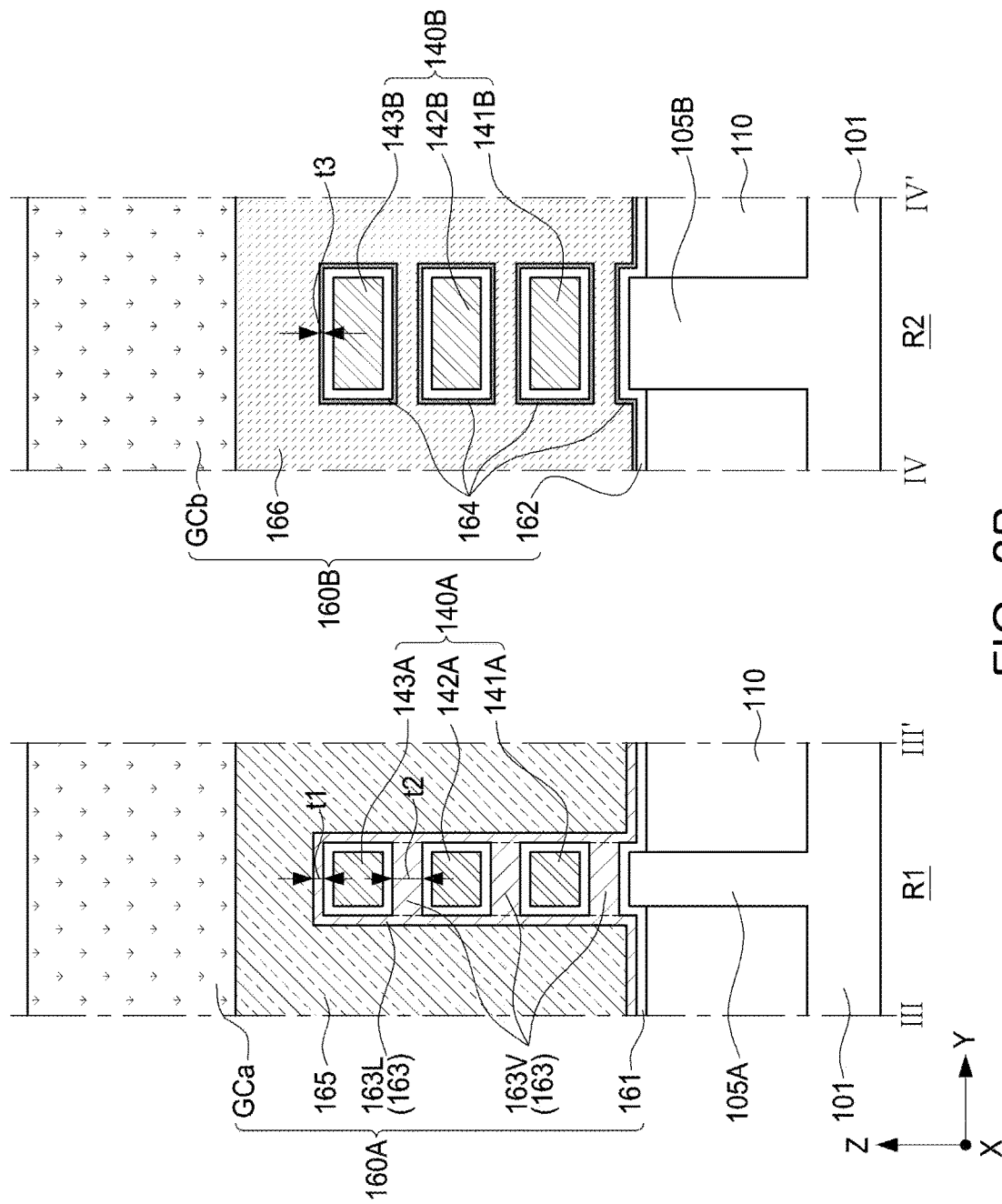

FIGS. 2A and 2B illustrate cross-sectional views schematically showing semiconductor devices according to embodiments of the inventive concepts. FIG. 2A illustrates cross-sectional views of the semiconductor device of FIG. 1 respectively taken along lines I-I' and FIG. 2B illustrates cross-sectional views of the semiconductor device of FIG. 1 respectively taken along lines and IV-IV'.

Referring to FIGS. 1 to 2B, a semiconductor device 100 may include a substrate 101 having a first region R1 and a second region R2, a first active fin 105A and a second active fin 105B respectively disposed in the first region R1 and the second region R2 of the substrate 101, a separation insulating layer 110 defining the first and second active fins 105A and 105B, a first channel structure 140A on the first active fin 105A, a second channel structure 140B on the second active fin 105B, a first gate structure 160A intersecting the first active fin 105A, a second gate structure 160B intersecting the second active fin 105B, first source/drain regions 150A disposed on the first active fin 105A on both sides of the first gate structure 160A, and second source/drain regions 150B disposed on the second active fin 105B on both sides of the second gate structure 160B. The semiconductor device 100 may further include contact structures 180 respectively connected to the first and second source/drain regions 150A and 150B, internal spacer layers 130 contacting the second source/drain regions 150B, and an interlayer insulating layer 190.

In the semiconductor device 100, the first active fin 105A may have a fin structure, and at least a portion of a first gate pattern (161, 163, and 165) of the first gate structure 160A may be disposed between the first active fin 105A and the first channel structure 140A, between channel layers 141A, 142A, and 143A of the first channel structure 140A, and on the first channel structure 140A. The first gate pattern (161, 163, and 165) may be disposed between the first source/drain regions 150A to surround the first channel structure 140A. Therefore, the semiconductor device 100 may include a Multi Bridge Channel FET (MBCFET™) formed by the first channel structure 140A, the first source/drain regions 150A, and the first gate pattern (161, 163, and 165). The second active fin 105B, the second channel structure 140B, and a second gate pattern (162, 164, and 166) of the second gate structure 160B may also have similar structures, and may configure an MBCFET™.

The substrate 101 may include a semiconductor material such as for example a group IV semiconductor, a group III-V compound semiconductor, or a group II-VI compound semiconductor. For example, the group IV semiconductor may include silicon (Si), germanium (Ge), or silicon germanium (SiGe). The substrate 101 may be provided as a bulk wafer, an epitaxial layer, a silicon-on-insulator (SOI) layer, a semiconductor-on-insulator (SeOI) layer, or the like. The substrate 101 may include the first region R1 and the second region R2. The first region R1 and the second region R2 may be adjacent to each other in a Y direction, but are not limited thereto. Transistors having different characteristics with respect to each other may be disposed in the first region R1 and the second region R2, respectively. For example, a PMOS field effect transistor may be disposed in the first region R1, and an NMOS field effect transistor may be disposed in the second region R2, but are not limited thereto.

The first and second active fins 105A and 105B may be disposed in the first and second regions R1 and R2 of the substrate 101, respectively, may be defined by the separation insulating layer 110, and may be arranged to extend in a first direction, for example in an X direction. The first and second active fins 105A and 105B may include a structure protruding from the substrate 101 onto the separation insulating layer 110. The first and second active fins 105A and 105B may be formed as a portion of the substrate 101, and may include an epitaxial layer grown from the substrate 101. On both sides of each of the first and second gate structures 160A and 160B, the first and second active fins 105A and 105B on the substrate 101 may respectively be partially recessed, and the first and second source/drain regions 150A and 150B may be respectively disposed on the recessed parts of the first and second active fins 105A and 105B.

According to embodiments, the first and second active fins 105A and 105B may include impurities, and at least some of the first and second active fins 105A and 105B may include impurities having different types of conductivity, but are not limited thereto. In an example embodiment, the first active fin 105A may include active fins having different widths in the Y direction with respect to each other, and the second active fin 105B may also include active fins having different widths in the Y direction with respect to each other. Therefore, transistors having different channel widths may be provided.

The separation insulating layer 110 may define the first and second active fins 105A and 105B in the substrate 101.

The separation insulating layer 110 may be formed by, for example, a shallow trench isolation (STI) process. The separation insulating layer 110 may be disposed to cover side surfaces of the first and second active fins 105A and 105B, and may extend in the first direction, for example in the X direction. The separation insulating layer 110 may be formed of an insulating material.

The first channel structure 140A may include a plurality of first channel layers disposed on the first active fin 105A and spaced apart from each other in a direction perpendicular to an upper surface of the first active fin 105A, for example in a Z direction. The plurality of first channel layers may include a first lower channel layer 141A, a first intermediate channel layer 142A, and a first upper channel layer 143A. The number of layers forming the plurality of first channel layers is not limited to those illustrated in the drawings, and may be variously changed according to other embodiments. Widths of first channel layers 141A, 142A, and 143A in the Y direction may be narrower than widths of second channel layers 141B, 142B, and 143B in the Y direction, respectively, but are not limited thereto. Widths of first channel layers 141A, 142A, and 143A in the Y direction may be substantially identical to or different from widths of second channel layers 141B, 142B, and 143B in the Y direction, respectively.

The second channel structure 140B may include a plurality of second channel layers disposed on the second active fin 105B and spaced apart from each other in a direction perpendicular to an upper surface of the second active fin 105B, for example in the Z direction. The plurality of second channel layers may include a second lower channel layer 141B, a second intermediate channel layer 142B, and a second upper channel layer 143B. The number of layers forming the plurality of second channel layers is not limited to those illustrated in the drawings, and may be variously changed according to other embodiments. A separation distance between the second channel layers 141B, 142B, and 143B in the Z direction may be substantially identical to a separation distance between the first channel layers 141A, 142A, and 143A in the Z direction.

The plurality of first and second channel layers forming the first and second channel structures 140A and 140B may include a semiconductor material such as for example silicon (Si), silicon-germanium (SiGe), or germanium (Ge). The plurality of first and second channel layers constituting the first and second channel structures 140A and 140B may be formed of, for example, the same material as that of the substrate 101. In some embodiments, the plurality of first and second channel layers forming the first and second channel structures 140A and 140B may include an impurity region located in a region adjacent to the first and second source/drain regions 150A and 150B, respectively.

In some embodiments, in the first region R1, first active fins 105A having different widths in the Y direction may be provided, and channel layers having different widths in the Y direction may be provided on each of the first active fins 105A having different widths. Also in the second region R2, second active fins 105B having different widths in the Y direction may be provided, and channel layers having different widths in the Y direction may be provided on each of the second active fins 105B having different widths. Therefore, PMOS field effect transistors having different threshold voltages and NMOS field effect transistors having different threshold voltages may be provided.

The first source/drain regions 150A may be disposed on the first active fin 105A on both sides of the first gate structure 160A. The first source/drain regions 150A may be arranged to be connected to respective side surfaces of the plurality of first channel layers of the first channel structure 140A, and cover the first active fin 105A at a lower end of the first source/drain region 150A. The first source/drain regions 150A may be disposed by partially recessing an upper portion of the first active fin 105A, but in other embodiments, whether or not the recess is provided and a depth of the recess may be variously changed.

The second source/drain regions 150B may be disposed on the second active fin 105B on both sides of the second gate structure 160B. The second source/drain regions 150B may be arranged to be connected to respective side surfaces of the plurality of second channel layers of the second channel structure 140B, and cover the second active fin 105B at a lower end of the second source/drain region 150B. The second source/drain regions 150B may be disposed by partially recessing an upper portion of the second active fin 105B, but in other embodiments, whether or not the recess is provided and the depth of the recess may be variously changed.

The first and second source/drain regions 150A and 150B may serve as a source region or a drain region of a transistor, respectively. The first and second source/drain regions 150A and 150B may include a semiconductor layer including silicon (Si), and may be formed as an epitaxial layer. The first and second source/drain regions 150A and 150B may include impurities having different types and/or concentrations. For example, the first source/drain regions 150A may include p-type doped silicon germanium (SiGe), and the second source/drain regions 150B may include n-type doped silicon (Si). In example embodiments, at least one of the first and second source/drain regions 150A and 150B may include a plurality of regions including elements and/or doping elements having different concentrations.

The first gate structure 160A may be disposed on the first active fin 105A and the first channel structure 140A to intersect the first active fin 105A and the first channel structure 140A, and may extend in the second direction, for example in the Y direction. A channel region of a transistor may be formed in the first active fin 105A and the first channel structure 140A, intersecting the first gate structure 160A. The first gate structure 160A may include a first gate pattern (161, 163, and 165), first spacer layers SPa on both sides of the first gate pattern (161, 163, and 165), and a first gate capping layer GCa on the first gate pattern (161, 163, and 165). The first gate pattern (161, 163, and 165) may surround at least a portion of the first channel layers 141A, 142A, and 143A. The first gate pattern (161, 163, and 165) may include a first gate dielectric layer 161, a first conductive layer 163, and a second conductive layer 165. The first conductive layer 163 and the second conductive layer 165 may form a first gate electrode (163 and 165). The first gate electrode (163 and 165) may be spaced apart from the first channel layers 141A, 142A, and 143A by the first gate dielectric layer 161.

The first gate dielectric layer 161 may be disposed between the first active fin 105A and the first channel structure 140A, and between the first channel layers 141A, 142A, and 143A of the first channel structure 140A. The first gate dielectric layer 161 may cover a protruding portion of the first active fin 105A, and may extend to cover the separation insulating layer 110. The first gate dielectric layer 161 may be disposed to surround all surfaces except for an uppermost surface of the first gate electrode (163 and 165), and may extend between the first gate electrode (163 and 165) and the first spacer layers SPa. For example, the first gate dielectric layer 161 may conformally cover an upper surface of an uppermost first channel layer 143A, and inner side surfaces of the first spacer layers SPa. The first gate dielectric layer 161 may be disposed to fill a space between the first channel layers 141A, 142A, and 143A, together with the first conductive layer 163.

The first conductive layer 163, together with the first gate dielectric layer 161, may include inner portions 163V (i.e., inner conductive layers) filling spaces between the first channel layers 141A, 142A, and 143A, and may further include a liner portion 163L disposed on the upper surface of the uppermost first channel layer 143A from among the first channel layers 141A, 142A, and 143A. The liner portion 163L may have a first thickness t1 in the Z direction. The first conductive layer 163 may be in direct contact with the first gate dielectric layer 161.

As illustrated in FIG. 2B, the liner portion 163L may extend below opposite side surfaces of the first upper channel layer 143A in the Y direction with a thickness in the Y direction substantially equal to the first thickness t1. As illustrated in FIG. 2A, the liner portion 163L may extend in an upward direction along inner side surfaces of the first gate dielectric layer 161 covering the inner side surfaces of the first spacer layers SPa on the upper surface of the uppermost first channel layer 143A with a thickness in the X direction substantially equal to the first thickness t1. The liner portion 163L may extend onto the first gate dielectric layer 161 covering the separation insulating layer 110. The liner portion 163L may extend from the inner portions 163V. At least one of the inner portions 163V may have a second thickness t2 greater than the first thickness t1 in the Z direction. The inner portions 163V may be disposed between a lowermost first channel layer 141A and the first active fin 105A, and between the first channel layers 141A, 142A, and 143A. An interface between the liner portion 163L and the inner portions 163V may or may not be visible depending on deposition conditions of a conductive material layer.

In an example, the first thickness t1 may be a thickness of the liner portion 163L in a central portion of the first gate pattern (161, 163, and 165), and the second thickness t2 may be a thickness of the inner portion 163V in the central portion of the first gate pattern (161, 163, and 165).

In an example, the first thickness t1 may be less than about 0.5 times the second thickness t2. In an example, the first thickness t1 may be about 3 nm or less, for example about 2.5 nm or less. In an example, the first thickness t1 may be about 1 nm or more, for example about 1.5 nm or more. In an example, the second thickness t2 may be about 5 nm or more, for example about 6 nm or more, and about 10 nm or less, for example about 7 nm or less.

The second conductive layer 165 may be disposed on the first conductive layer 163. The second conductive layer 165 may cover the liner portion 163L of the first conductive layer 163, and may extend in the Y direction. The second conductive layer 165 is not disposed in a space between the first channel layers 141A, 142A, and 143A, and is not disposed between the lowermost first channel layer 141A and the first active fin 105A. For example, the second conductive layer 165 may be spaced apart from the inner portions 163V of the first conductive layer 163. The second conductive layer 165 may be referred to as a 'capping conductive layer.'

The first spacer layers SPa may be disposed on both side surfaces of the first gate pattern (161, 163, and 165), and may extend in the Z direction perpendicular to an upper surface of the substrate 101. The first spacer layers SPa may intersect the first active fin 105A and may extend in the Y direction. The first spacer layers SPa may insulate the first source/drain regions 150A from the first gate electrode (163 and 165). The first spacer layers SPa may have a multilayer structure in some embodiments. The first spacer layers SPa may include at least one of silicon oxide, silicon nitride, or silicon oxynitride.

The first gate capping layer GCa may be disposed on the first gate electrode (163 and 165). The first gate capping layer GCa may be disposed to extend along an upper surface of the first gate electrode (163 and 165) in the second direction, for example in the Y direction. The first gate capping layer GCa may be disposed to be recessed into and fill a portion of an upper portion of the first gate pattern (161, 163, and 165). Therefore, the first gate capping layer GCa may have a lower surface having a downwardly convex shape and an upper surface having a substantially flat shape. The upper surface of the first gate capping layer GCa may have a maximum width filling a space between the contact structures 180 in the X direction. The maximum width may be greater than a distance between outer side surfaces of the first spacer layers SPa. The first gate capping layer GCa may include at least one of silicon oxide, silicon nitride, or silicon oxynitride, and may include for example at least one of SiO, SiN, SiCN, SiOC, SiON, or SiOCN.

The second gate structure 160B may be disposed on the second active fin 105B and the second channel structure 140B to intersect the second active fin 105B and the second channel structure 140B, and may extend in the second direction, for example in the Y direction. A channel region of a transistor may be formed in the second active fin 105B and the second channel structure 140B, intersecting the second gate structure 160B. The second gate structure 160B may include a second gate pattern (162, 164, and 166), second spacer layers SPb on both sides of the second gate pattern (162, 164, and 166), and a second gate capping layer GCb on the second gate pattern (162, 164, and 166). The second gate pattern (162, 164, and 166) may surround at least a portion of the second channel layers 141B, 142B, and 143B. The second gate pattern (162, 164, and 166) may include a second gate dielectric layer 162, a third conductive layer 164, and a fourth conductive layer 166. The third conductive layer 164 and the fourth conductive layer 166 may form a second gate electrode (164 and 166). The second gate electrode (164 and 166) may be spaced apart from the second channel layers 141B, 142B, and 143B by the second gate dielectric layer 162.

The second gate dielectric layer 162 may be disposed between the second active fin 105B and the second channel structure 140B, and between the second channel layers 141B, 142B, and 143B of the second channel structure 140B. The second gate dielectric layer 162 may cover a protruding portion of the second active fin 105B, and may extend to cover the separation insulating layer 110. The second gate dielectric layer 162 may be disposed to surround all surfaces except for an uppermost surface of the second gate electrode (164 and 166), and may extend between the second gate electrode (164 and 166) and the second spacer layers SPb. For example, the second gate dielectric layer 162 may conformally cover an upper surface of an uppermost second channel layer 143B and inner side surfaces of the second spacer layers SPb. The second gate dielectric layer 162 may be disposed to fill a space between the second channel layers 141B, 142B, and 143B, together with the third conductive layer 164 and the fourth conductive layer 166. A thickness of each of the first and second gate dielectric layers 161 and 162 may be about 1 nm or more and about 2.5 nm or less.

The third conductive layer 164 may cover the second gate dielectric layer 162 and may have a third thickness t3 which is substantially conformal. The third conductive layer 164 may extend along inner side surfaces of the second gate dielectric layer 162 covering the inner side surfaces of the second spacer layers SPb in an upward direction. The third conductive layer 164 may have a third thickness t3 that is less than the first thickness t1 in the Z direction in a space between an upper surface of the uppermost second channel layer 143B from among the second channel layers 141B, 142B, and 143B, and a lower surface of the fourth conductive layer 166, at a higher level than the uppermost second channel layer 143B. As used herein, the term "level" may mean the distance from an upper main surface of substrate 101 in the vertical direction (i.e., the Z direction).

In an example, the second thickness t2 may be greater than about twice a difference between the first thickness t1 and the third thickness t3. In an example, the third thickness t3 may be 0.5 nm or more and 1 nm or less.

The fourth conductive layer 166 may be disposed on the third conductive layer 164. The fourth conductive layer 166 may be disposed to surround the third conductive layer 164, and may extend in the Y direction.

The second spacer layers SPb may be disposed on both side surfaces of the second gate pattern (162, 164, and 166), and may extend in the Z direction perpendicular to the upper surface of the substrate 101. The second spacer layers SPb may intersect the second active fin 105B, and may extend in the Y direction. The second spacer layers SPb may insulate the second source/drain regions 150B from the second gate electrode (164 and 166). The second spacer layers SPb may have a multilayer structure in some embodiments. The second spacer layers SPb may include at least one of silicon oxide, silicon nitride, or silicon oxynitride.

The second gate capping layer GCb may be disposed on the second gate electrode (164 and 166). The second gate capping layer GCb may be disposed to extend along an upper surface of the second gate electrode (164 and 166) in the second direction, for example in the Y direction. The second gate capping layer GCb may be disposed to be recessed into and fill a portion of an upper portion of the second gate pattern (162, 164, and 166). Therefore, the second gate capping layer GCb may have a lower surface having a downwardly convex shape and an upper surface having a substantially flat shape. The upper surface of the second gate capping layer GCb may have a maximum width filling a space between the contact structures 180 in the X direction. The maximum width may be greater than a distance between outer side surfaces of the second spacer layers SPb. The second gate capping layer GCb may include at least one of silicon oxide, silicon nitride, or silicon oxynitride, and may include for example at least one of SiO, SiN, SiCN, SiOC, SiON, or SiOCN.

The gate dielectric layers 161 and 162 may for example include an oxide, a nitride, or a high-k material, respectively. The high-k material may refer to a dielectric material having a higher dielectric constant than that of a silicon oxide layer ($SiO_2$). The high-k material may be, for example, one of aluminum oxide ($Al_2O_3$), tantalum oxide ($Ta_2O_5$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), or praseodymium oxide ($Pr_2O_3$).

The conductive layers 163, 164, 165, and 166 constituting the gate electrodes may include a conductive material, and may include, for example, a material such as TiN, TiC, TiAl, TiAlN, TiSiN, TiAlC, TaN, TaC, TaAl, TaAlN, TaAlN, WN, Al, W, Mo, and the like. For example, the first conductive layer 163, the second conductive layer 165, and the third conductive layer 164 may include TiN, respectively, and the fourth conductive layer 166 may include TiAlC. The conductive layers 163, 164, 165, and 166 constituting the gate electrodes may include a semiconductor material such as doped polysilicon. According to a configuration of the semiconductor device 100, the first gate pattern (161, 163, and 165) and the second gate pattern (162, 164, and 166) may extend on the same straight line in the Y direction, and the first gate pattern (161, 163, and 165) and the second gate pattern (162, 164, and 166) may be arranged to be separated by a separate gate separator (not shown) disposed therebetween.

The first and second gate capping layers GCa and GCb may include a material different from that of the interlayer insulating layer 190. The first and second gate capping layers GCa and GCb may align (self-align) a contact hole (H in FIG. 19) for forming the contact structure 180 between the first and second gate capping layers GCa and GCb, but are not limited thereto.

The internal spacer layers 130 may be disposed in parallel to the second gate pattern (162, 164, and 166) between the second channel layers 141B, 142B, and 143B, and between the second lower channel layer 141B and the second active fin 105B. The internal spacer layers 130 may be disposed between the second source/drain regions 150B and the second gate pattern (162, 164, and 166) in a space between the second channel layers 141B, 142B, and 143B. The internal spacer layers 130 may have an outer side surface substantially coplanar with an outer side surface of each of the second channel layers 141B, 142B, and 143B. In lower portions of the second channel layers 141B, 142B, and 143B, the second gate pattern (162, 164, and 166) may be spaced apart from the second source/drain regions 150B by the internal spacer layers 130. Although not shown in FIG. 2A, the internal spacer layers 130 may have a shape in which side surfaces opposing the second gate pattern (162, 164, and 166) are convexly rounded inward toward the second gate pattern (162, 164, and 166), but are not limited thereto. The internal spacer layers 130 may for example be formed of silicon oxide, silicon nitride, or silicon oxynitride. In some embodiments, the internal spacer layers 130 may be omitted, or may be further disposed between the first source/drain regions 150A and a portion (e.g., 161 and 163V) of the first gate pattern (161, 163, and 165) in the first region R1.

The contact structures 180 may pass through the interlayer insulating layer 190 in the vertical direction, for example in the Z direction, on both sides of the first gate structure 160A or on both sides of the second gate structure 160B. The contact structures 180 may be respectively connected to the first and second source/drain regions 150A and 150B. For example, the contact structures 180 may include a first contact structure 180 connected to the first source/drain regions 150A on both sides of the first gate pattern (161, 163, and 165), and a second contact structure 180 connected to the second source/drain regions 150B on both sides of the second gate pattern (162, 164, and 166). The contact structures 180 may have slanted side surfaces in which a width of a lower portion gradually becomes narrower than a width of an upper portion according to an aspect ratio, but are not limited thereto. The contact structure 180 may include a metal-semiconductor compound layer 182, a barrier layer 184, and a plug layer 186.

The metal-semiconductor compound layer 182 may include, for example, metal silicide, metal germanide, or metal silicide-germanide. In the metal-semiconductor compound layer 182, the metal may for example be titanium (Ti), nickel (Ni), tantalum (Ta), cobalt (Co), or tungsten (W), and the semiconductor may be silicon (Si), germanium (Ge), or silicon germanium (SiGe). For example, the metal-semiconductor compound layer 182 may include at least one of cobalt silicide (CoSi), titanium silicide (TiSi), nickel silicide (NiSi), or tungsten silicide (WSi).

The barrier layer 184 may surround a lower surface and side surfaces of the plug layer 186. The barrier layer 184 may include a metal nitride, for example at least one of titanium nitride (TiN), tantalum nitride (TaN), or tungsten nitride (WN). The plug layer 186 may include a metal material, for example at least one of aluminum (Al), copper (Cu), tungsten (W), cobalt (Co), ruthenium (Ru), or molybdenum (Mo). In an embodiment, the barrier layer 184 may be omitted.

The interlayer insulating layer 190 may be disposed on the separation insulating layer 110, the source/drain regions 150A and 150B, and the gate structures 160A and 160B. The interlayer insulating layer 190 may include, for example, at least one of silicon oxide, silicon nitride, or silicon oxynitride, and may include a low-k material.

Figure 3:
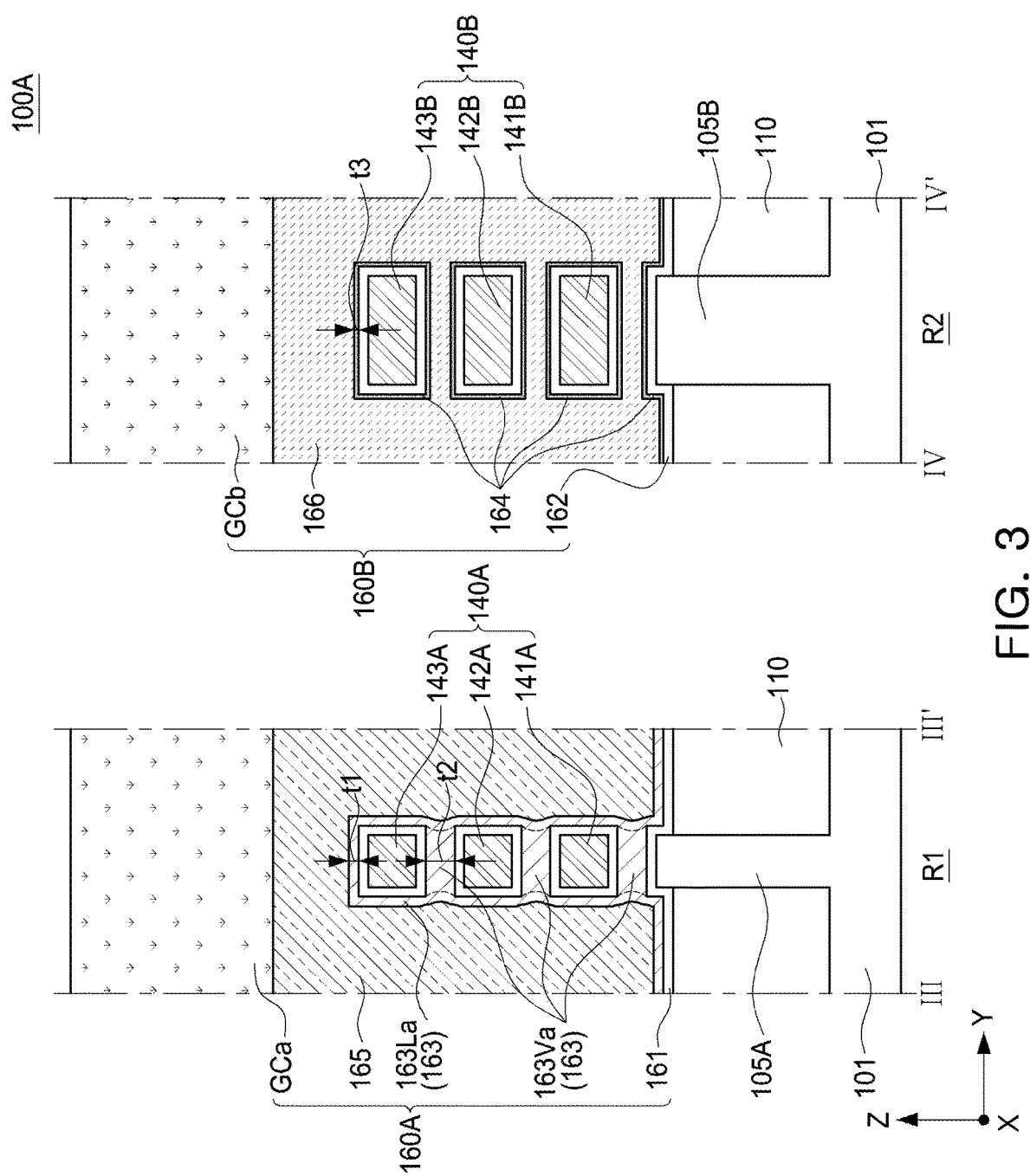
FIG. 3 illustrates a cross-sectional view schematically showing a semiconductor device according to embodiments of the inventive concepts.
Figure 4:
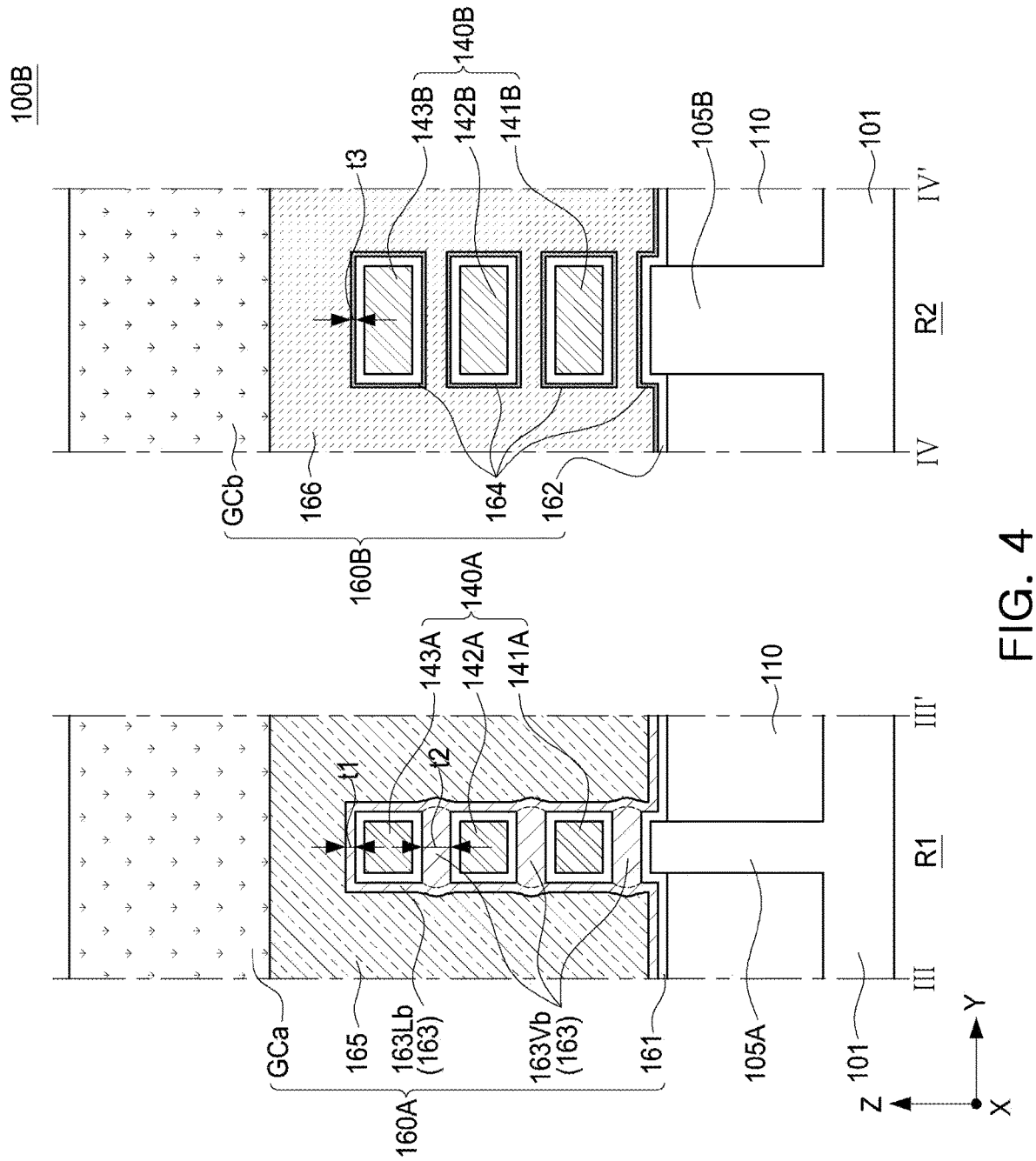
FIG. 4 illustrates a cross-sectional view schematically showing a semiconductor device according to embodiments of the inventive concepts.

FIG. 3 illustrates a cross-sectional view schematically showing a semiconductor device according to embodiments of the inventive concepts. FIG. 4 illustrates a cross-sectional view schematically showing a semiconductor device according to embodiments of the inventive concepts. FIGS. 3 and 4 respectively illustrate regions corresponding to FIG. 2B. Description of elements in FIGS. 3 and 4 that are the same as given with respect to FIGS. 1-2B are omitted from the following for conciseness.

Referring to FIG. 3, in the semiconductor device 100A, side surfaces of inner portions 163Va of a first conductive layer 163 may be inwardly concave in the Y direction, and a portion of an outer side surface of a liner portion 163La may be a curved surface inwardly concave toward the inner portions 163Va.

Referring to FIG. 4, in the semiconductor device 100B, side surfaces of inner portions 163Vb of a first conductive layer 163 may be outwardly convex in the Y direction, and a portion of an outer side surface of a liner portion 163Lb may be a curved surface outwardly convex toward an outer side of the inner portions 163Vb.

Figure 5:
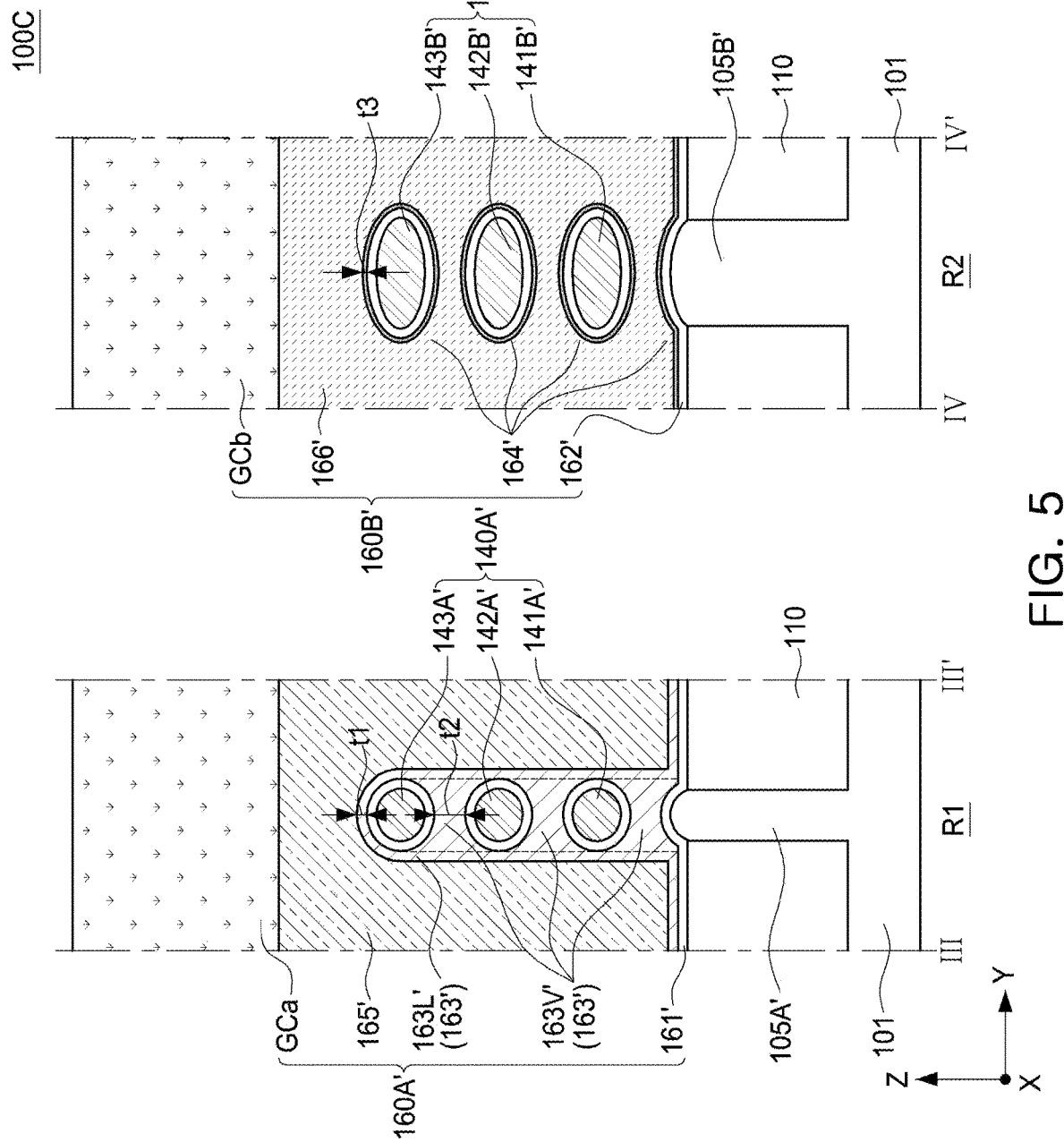
FIG. 5 illustrates a cross-sectional view schematically showing a semiconductor device according to embodiments of the inventive concepts.

FIG. 5 illustrates a cross-sectional view schematically showing a semiconductor device according to embodiments of the inventive concepts. FIG. 5 illustrates a region corresponding to FIG. 2B. Description of elements in FIG. 5 that are the same as given with respect to FIGS. 1-2B are omitted from the following for conciseness.

Referring to FIG. 5, in the semiconductor device 100C, upper surfaces of first and second active fins 105A' and 105B' may be convexly curved surfaces, and first channel layers 141A', 142A', and 143A' of a first channel structure 140A' and second channel layers 141B', 142B', and 143B' of a second channel structure 140B' may have a circular shape, or an elliptical shape in which a difference in length between a major axis and a minor axis is small, in a cross-sectional view in the Y direction, respectively. First and second gate dielectric layers 161' and 162' may cover convex upper surfaces of the first and second active fins 105A' and 105B', and may have a circular or elliptical ring shape surrounding the channel layers 141A', 141B', 142A', 142B', 143A', and 143B'. An inner portion 163V' of a first conductive layer 163' may have a second thickness t2, which is a minimum thickness in the Z direction, at a central portion, and a liner portion 163L' may be substantially conformal and may have a first thickness t1 that is less than the second thickness t2. A thickness of the inner portion 163V' may increase in the Z direction approaching a side surface in the Y direction from the central portion.

Figure 6A:
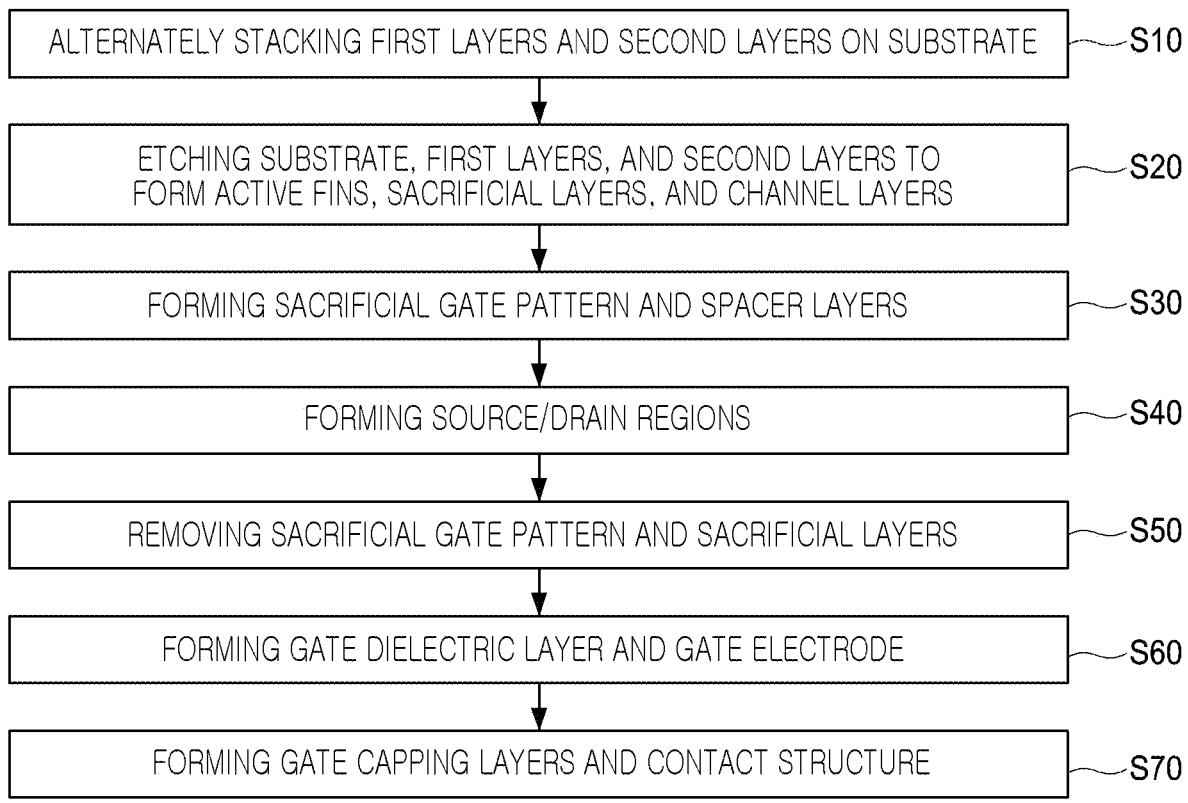
FIGS. 6A and 6B illustrate flowcharts explanatory of a method of manufacturing a semiconductor device according to embodiments of the inventive concepts.
Figure 6B:
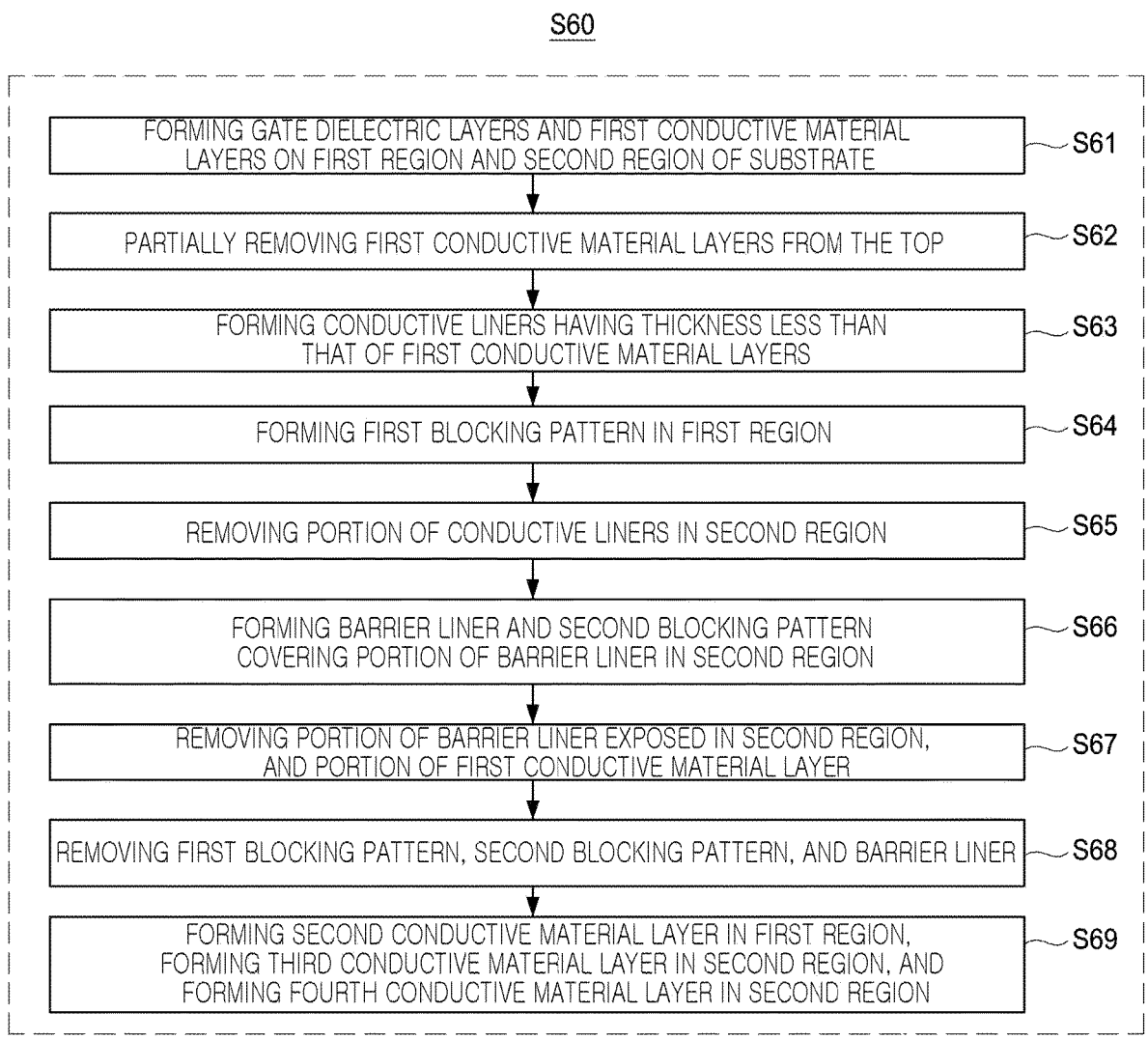

FIGS. 6A and 6B illustrate flowcharts explanatory of a method of manufacturing a semiconductor device according to embodiments of the inventive concepts.

FIGS. 7A to 19 illustrate views explanatory of a process sequence of a method of manufacturing a semiconductor device according to embodiments of the inventive concepts. FIGS. 7A to 19 illustrate an embodiment of a method of manufacturing the semiconductor device of FIGS. 1 to 2B. FIGS. 7A, 8A, 9A, 10A, 11A, 12A, 13A, 14A, 15A, 16A, 17A, 18A, and 19 illustrate views taken along lines I-I' and II-II' of FIG. 1 according to a process sequence. FIGS. 7B, 8B, 9B, 10B, 11B, 12B, 13B, 14B, 15B, 16B, 17B, and 18B illustrate views taken along lines and IV-IV' of FIG. 1 according to a process sequence.

Figure 7A:
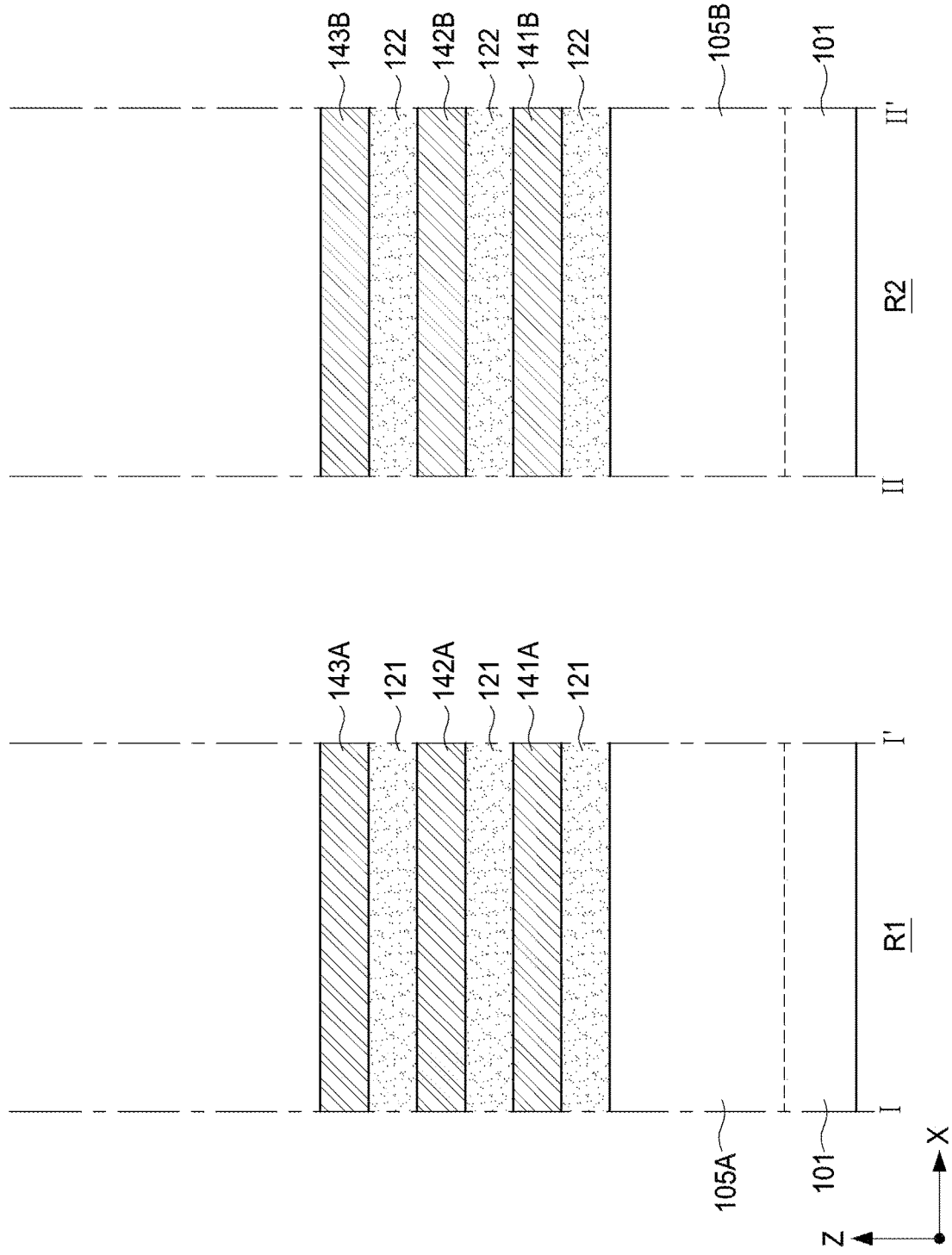
FIGS. 7A, 7B, 8A, 8B, 9A, 9B, 10A, 10B, 11A, 11B, 12A, 12B, 13A, 13B, 14A, 14B, 15A, 15B, 16A, 16B, 17A, 17B, 18A, 18B and 19 illustrate views showing a process sequence of a method of manufacturing a semiconductor device according to embodiments of the inventive concepts.
Figure 7B:
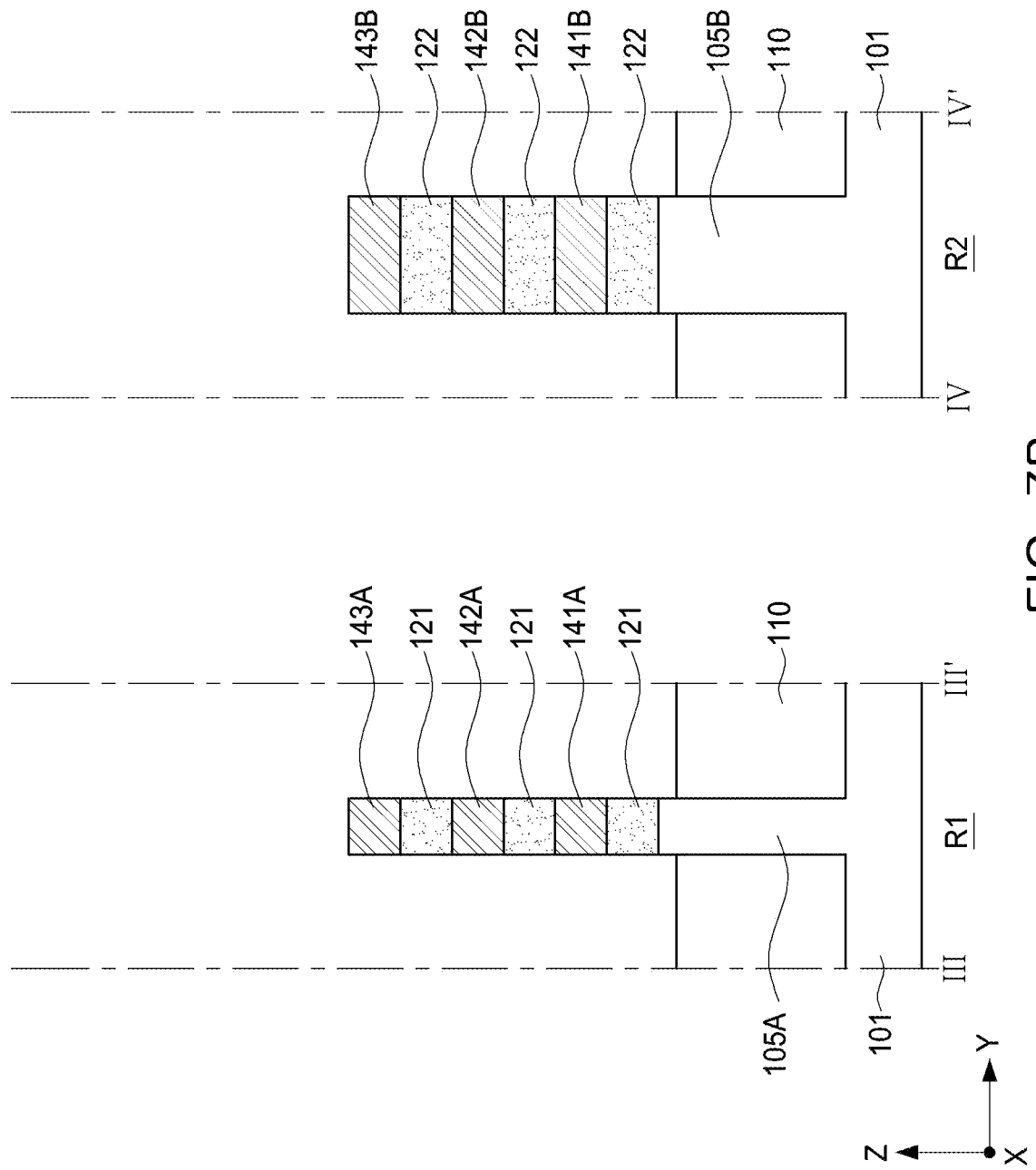

Referring to FIGS. 6A, 7A, and 7B, first layers and second layers are alternately stacked on a substrate 101 (S10), and the substrate 101, the first layers, and the second layers are etched to form active fins 105A and 105B, sacrificial layers 121 and 122, and channel layers 141A, 142A, 143A, 141B, 142B, and 143B (S20).

The first layers and the second layers may be formed by performing an epitaxial growth process using the substrate 101 as a seed. The number and thicknesses of the first layers and the second layers, to be stacked, may be variously changed in the embodiments.

First sacrificial layers 121 in which the first layers are patterned in a first region R1 may be layers to be replaced with a first gate dielectric layer 161 and a first conductive layer 163 (see FIGS. 2A and 2B) by subsequent processes. Second sacrificial layers 122 in which the first layers are patterned in a second region R2 may be layers to be replaced with a second gate dielectric layer 162 and a second gate electrode (164 and 166) (see FIGS. 2A and 2B) by subsequent processes. The second layers may be patterned in the first region R1 to form first channel layers 141A, 142A, and 143A, and the second layers may be patterned in the second region R2 to form second channel layers 141B, 142B, and 143B.

The first layers may be formed of a material having etch selectivity with respect to the second layers. The second layers may include a material that is different from that of the first layers. The first and second layers may include for example a semiconductor material including at least one of silicon (Si), silicon germanium (SiGe), or germanium (Ge), but may include different materials, and may or may not contain impurities. For example, the first sacrificial layers 121 formed by patterning the first layers may include silicon germanium (SiGe), and the channel layers 140 formed by patterning the second layers may include silicon (Si).

A portion of the substrate 101 is removed to form the active fins 105A and 105B having a shape protruding from an upper surface of the substrate 101. For example, a separation insulating layer 110 may be formed by filling an insulating material in the portion where the substrate 101 was removed, and then recessing the separation insulating layer 110 so that the active fins 105A and 105B protrude above the portion at which the substrate 101 was removed. An upper surface of the separation insulating layer 110 may be formed to be lower than upper surfaces of the active fins 105A and 105B.

Referring to FIGS. 6A and 8A to 9B, sacrificial gate pattern 170 and spacer layers SPa and SPb are formed (S30), and source/drain regions 150A and 150B are formed (S40).

After an interlayer insulating layer 190 is formed, the sacrificial gate pattern 170 and the sacrificial layers 121 and 122 are removed (S50).

Figure 8A:
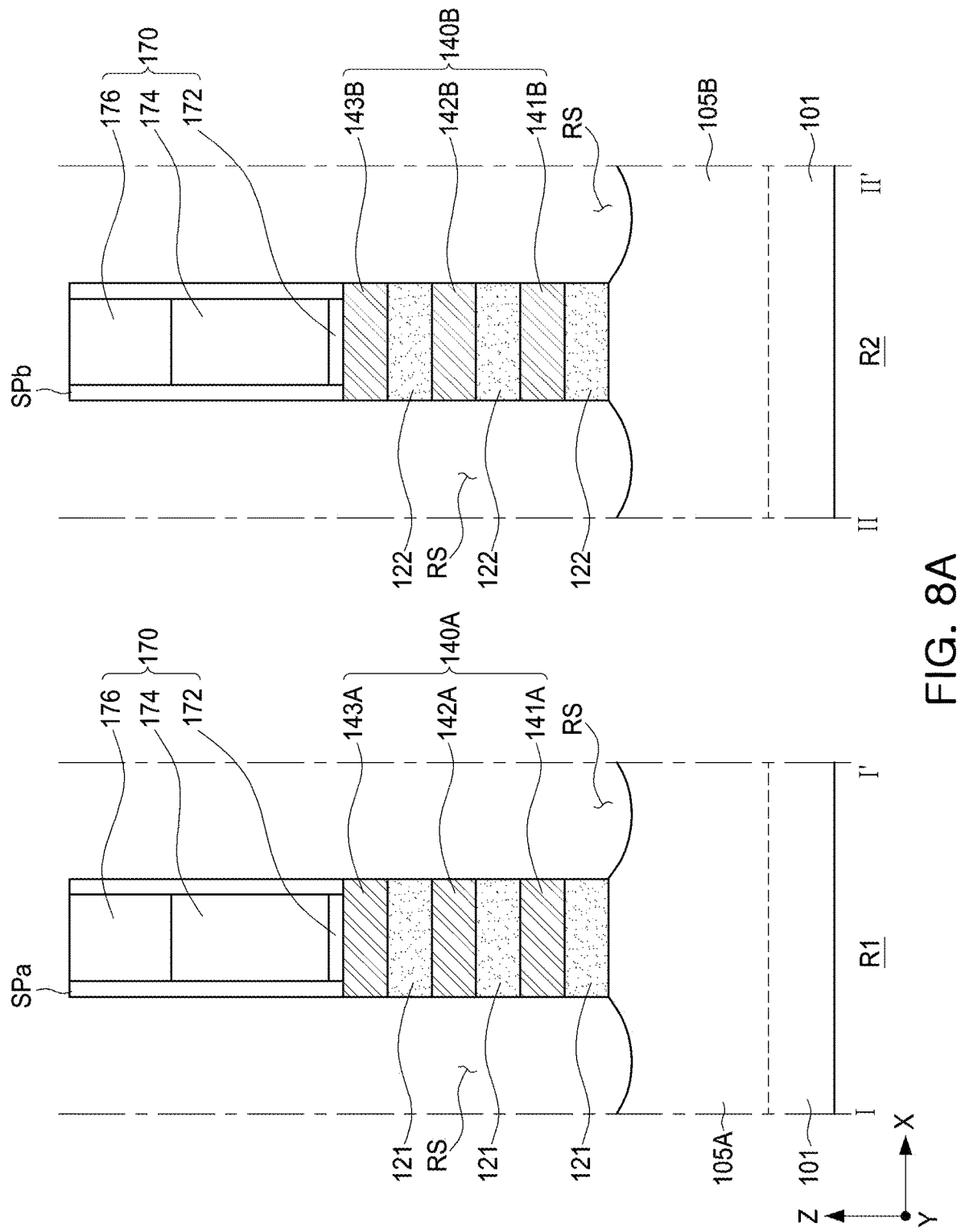
Figure 8B:
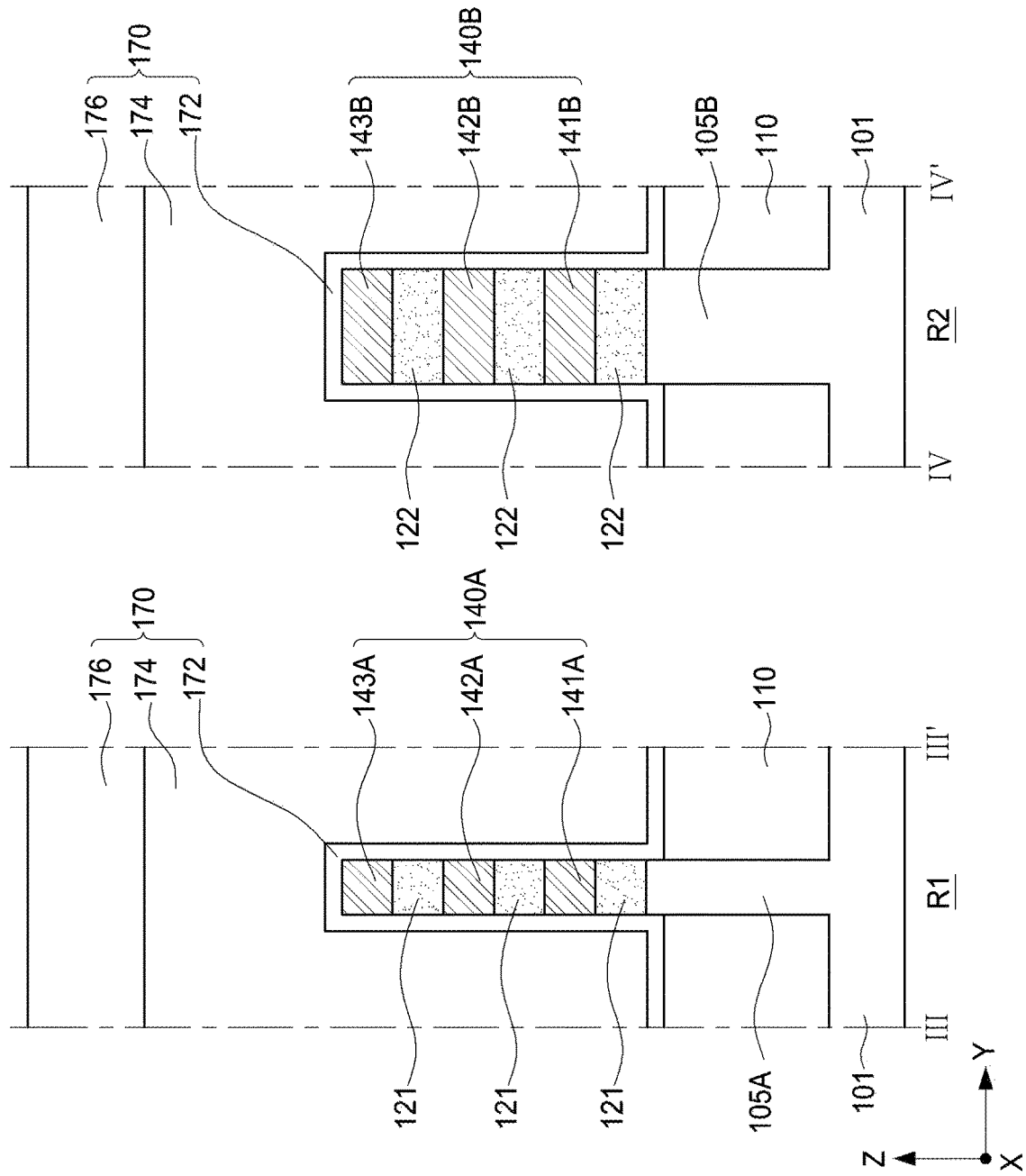

First, referring to FIGS. 8A and 8B, the sacrificial gate pattern 170 may be a sacrificial pattern formed in a region in which first and second gate patterns are disposed (see FIGS. 2A and 2B) by subsequent processes. The sacrificial gate pattern 170 may include first and second sacrificial gate layers 172 and 174 and a mask 176, sequentially stacked. The first and second sacrificial gate layers 172 and 174 may be patterned using the mask 176. The first and second sacrificial gate layers 172 and 174 may be an insulating layer and a conductive layer, respectively, but are not limited thereto, and the first and second sacrificial gate layers 172 and 174 may be formed as one layer. For example, the first sacrificial gate layer 172 may include silicon oxide, and the second sacrificial gate layer 174 may include polysilicon. The mask 176 may be formed as a carbon-containing material layer such as an amorphous carbon layer (ACL) or a spin-on hardmask (SOH). The sacrificial gate pattern 170 may have a linear shape intersecting the active fins 105A and 105B and the channel layers 141A, 142A, 143A, 141B, 142B, and 143B and extending in one direction, for example the Y direction.

The spacer layers SPa and SPb are formed on both sidewalls of the sacrificial gate pattern 170 in each of the first region R1 and the second region R2. The spacer layers SPa and SPb may be formed by forming a film of a uniform thickness on surfaces of the sacrificial gate pattern 170, the separation insulating layer 110, the sacrificial layers 121 and 122, and the channel layers 141A, 142A, 143A, 141B, 142B, and 143B, and performing anisotropic etching thereon. After forming the spacer layers SPa and SPb, the first sacrificial layers 121 and the first channel layers 141A, 142A, and 143A may be etched in the first region R1, and the second sacrificial layers 122 and the second channel layers 141B, 142B, and 143B may be etched in the second region R2, to form recess regions RS. The recess regions RS may recess a portion of the active fins 105A and 105B. Exposed portions of the sacrificial layers 121 and 122, and exposed portions of the channel layers 141A, 142A, 143A, 141B, 142B, and 143B may be removed using the sacrificial gate patterns 170 and the spacer layers SPa and SPb as masks. Thus, the channel layers 141A, 142A, 143A, 141B, 142B, and 143B may have a defined length in the X direction, and a first channel structure 140A and a second channel structure 140B may be formed.

Figure 9A:
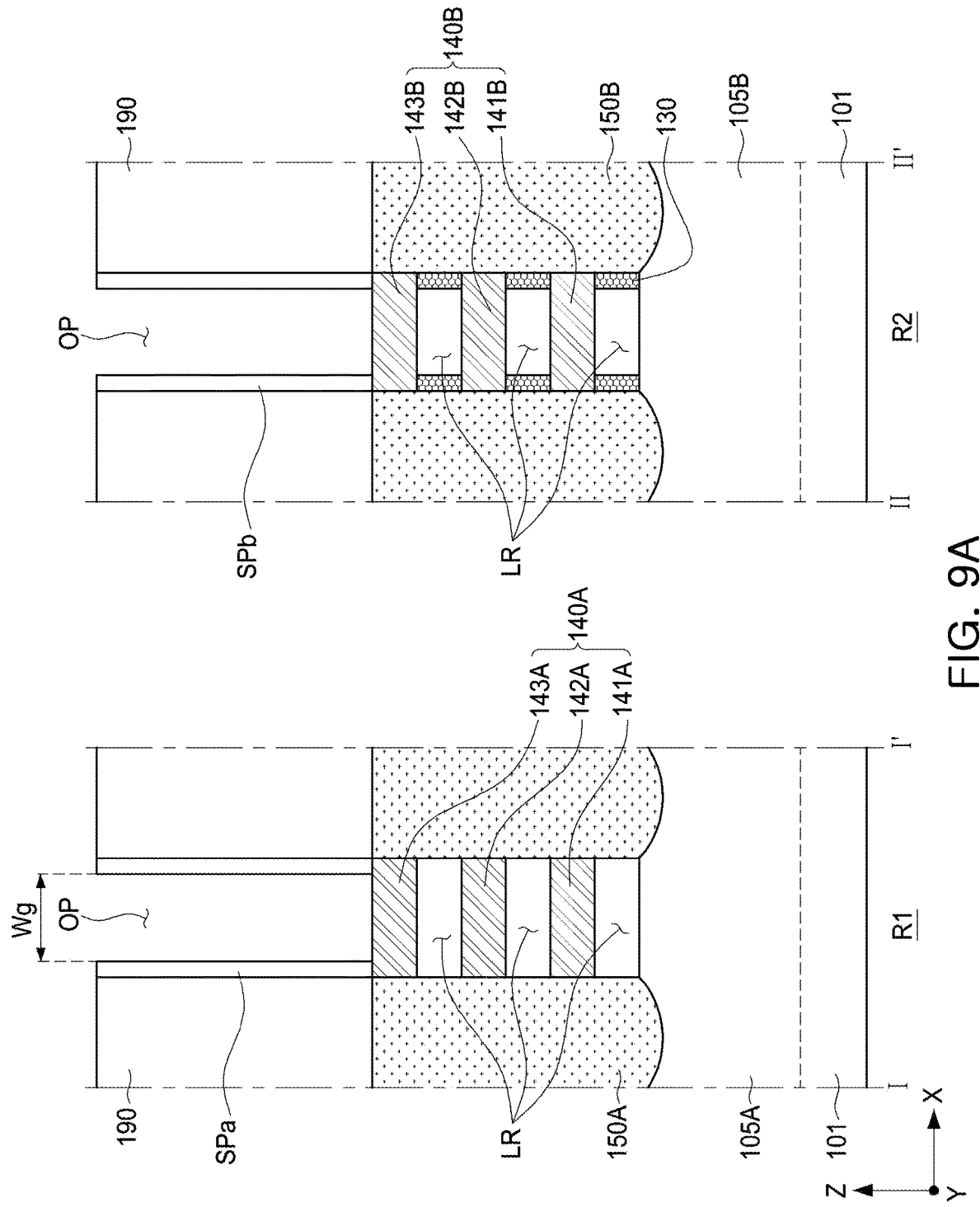
Figure 9B:
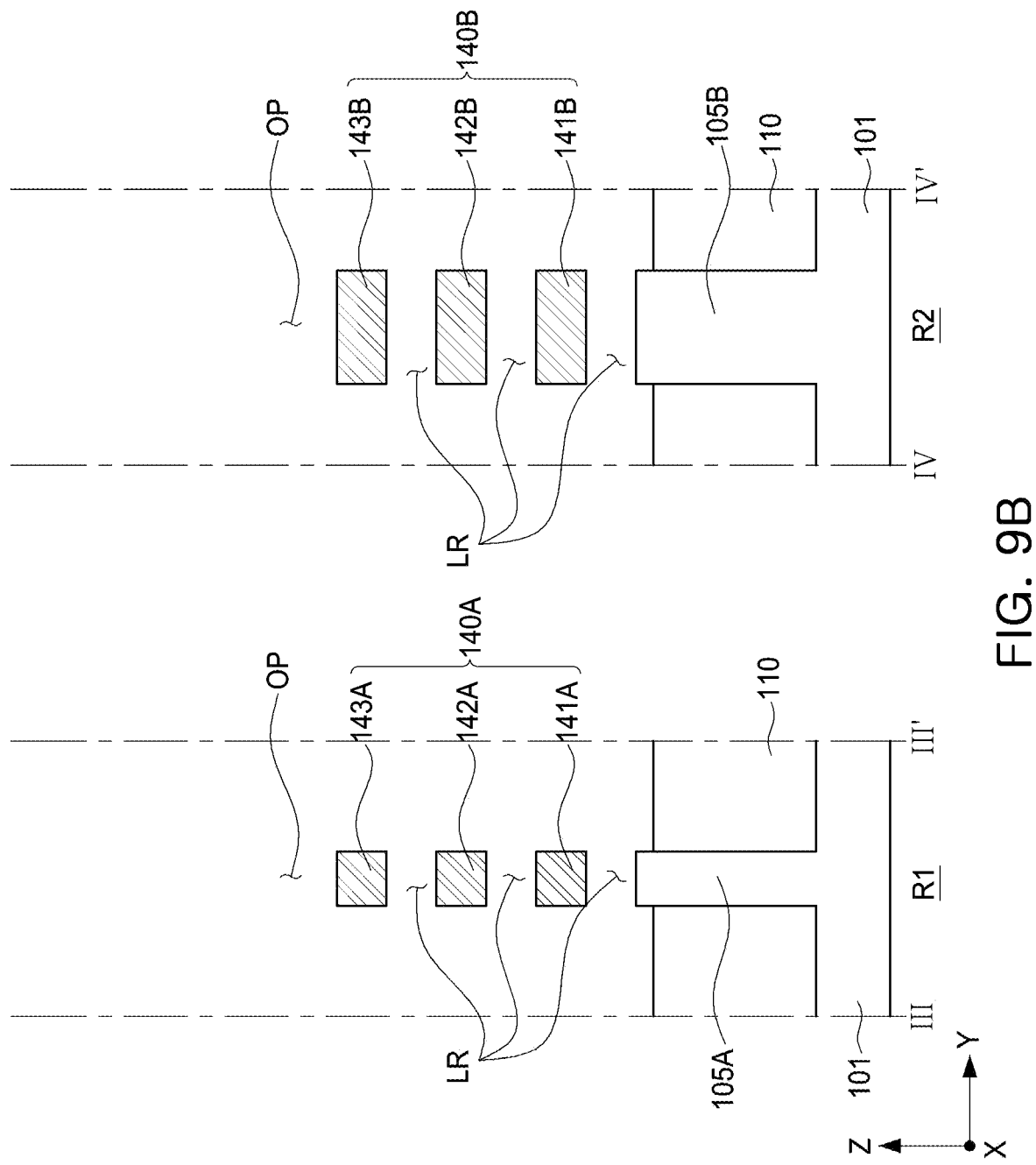

Next, referring to FIGS. 9A and 9B, after the source/drain regions 150A and 150B are formed and the interlayer insulating layer 190 is then formed, the sacrificial gate structure 170 and the sacrificial layers 121 and 122 are removed.

Before forming the source/drain regions 150A and 150B, a portion of the second sacrificial layers 122 exposed by the recess regions RS may be laterally removed, and internal spacer layers 130 may be formed in a region from which the second sacrificial layers 122 are removed. The internal spacer layers 130 may be formed by filling an insulating material in a region from which the second sacrificial layers 122 are removed and removing the insulating material deposited outside of the second channel layers 141B, 142B, and 143B.

The source/drain regions 150A and 150B may be formed on the active fins 105A and 105B recessed by the recess regions RS. The source/drain regions 150A and 150B may be formed in the recess regions RS by performing an epitaxial growth process. The source/drain regions 150A and 150B may be laterally connected to the channel layers 141A, 142A, 143A, 141B, 142B, and 143B. The source/drain regions 150A and 150B may include impurities by in-situ doping, and may include a plurality of layers having different doping elements and/or doping concentrations.

After forming an insulating material layer covering the sacrificial gate pattern 170, the spacer layers SPa and SPb, the source/drain regions 150A and 150B, and the separation insulating layer 110, the interlayer insulating layer 190 may be formed by planarizing the insulating material layer until an upper surface of the sacrificial gate pattern 170 is exposed.

The sacrificial gate pattern 170 and the sacrificial layers 121 and 122 may be selectively removed with respect to the spacer layers SPa and SPb, the channel layers 141A, 142A, 143A, 141B, 142B, and 143B, and the internal spacer layers 130. After removing the sacrificial gate pattern 170 to form an opening OP, the sacrificial layers 121 and 122 exposed through the opening OP may be removed to form gap regions LR. The removal process of the sacrificial gate pattern 170 and the sacrificial layers 121 and 122 may use at least one of a dry etching process and a wet etching process. The opening OP between the first spacer layers SPa may have a gate opening width Wg in the X direction. In an example, the gate opening width Wg may be about 12 nm or more and about 14 nm or less.

An operation (S60) of forming a gate dielectric layer and a gate electrode will be described with reference to FIGS. 6A, 6B, and 10A to 18B.

Figure 10A:
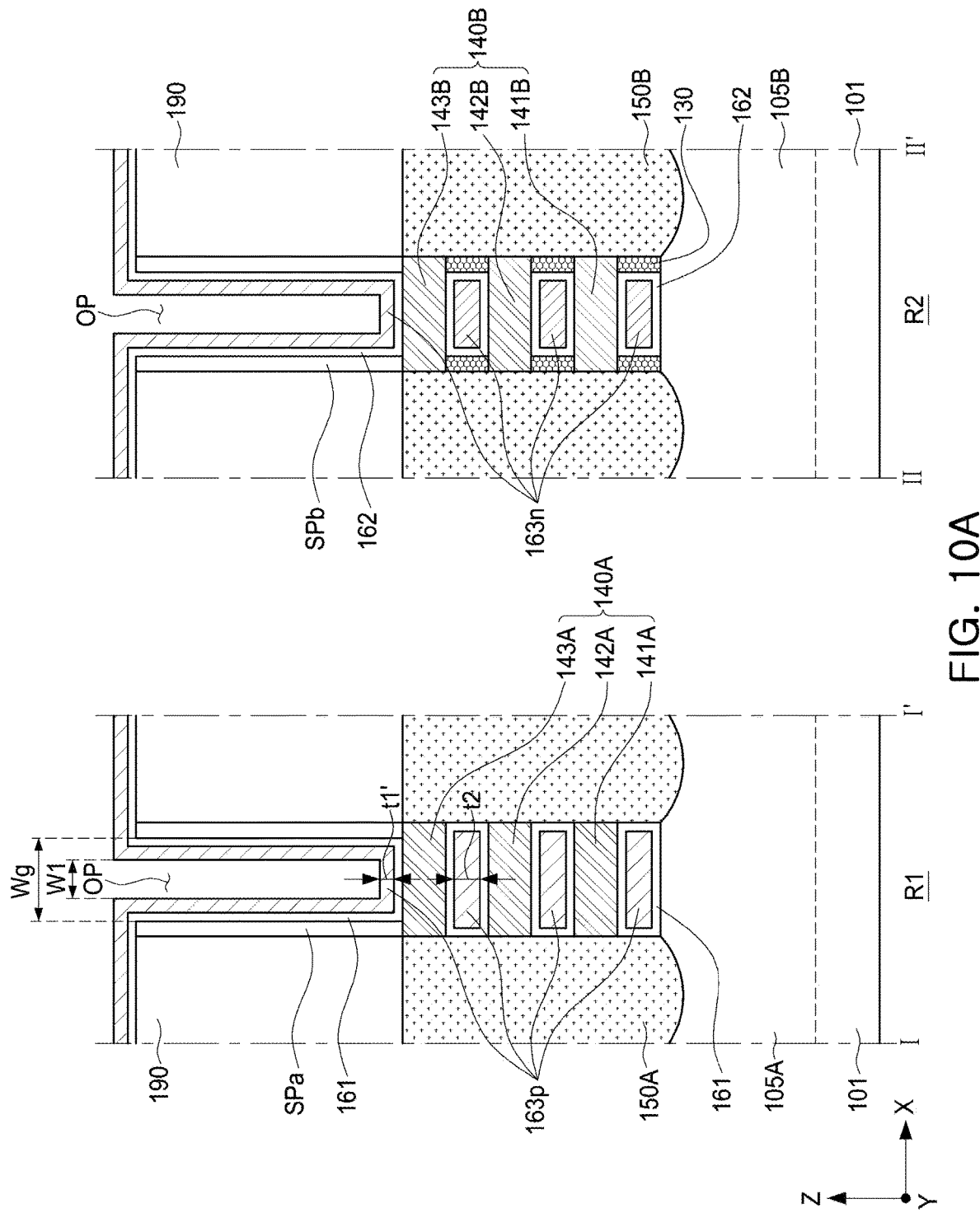
Figure 10B:
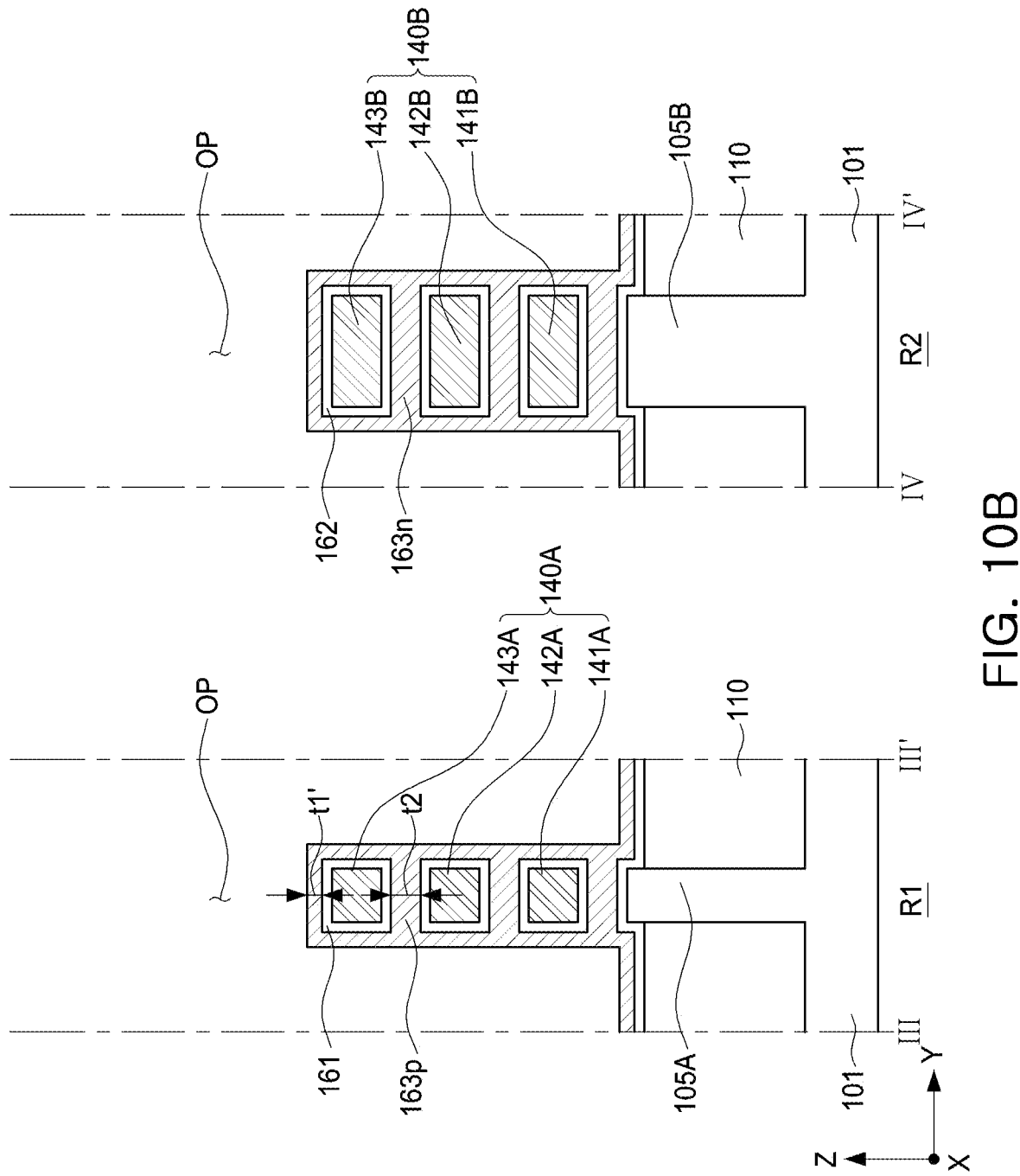

Referring to FIGS. 6B, 10A, and 10B, gate dielectric layers 161 and 162 and first conductive material layer 163$p$ and 163$n$ are formed on the first region R1 and the second region R2 of the substrate 101, respectively (S61).

First, the gate dielectric layers 161 and 162 may be formed to conformally cover inner side surfaces of the opening OP and the gap regions LR. A first gate dielectric layer 161 may be formed to cover the first channel structure 140A in the first region R1, and a second gate dielectric layer 162 may be formed to cover the second channel structure 140B in the second region R2. The first and second gate dielectric layers 161 and 162 may be integrally and entirely formed over the first and second regions R1 and R2. The first and second regions R1 and R2 may be respectively formed in separate process operations.

Next, the first conductive material layers 163$p$ and 163$n$ may fill the gap regions LR, and may be formed to extend along inner side surfaces of the opening OP in the Z direction, without completely filling the opening OP on an upper surface of an uppermost first channel layer 143A and an upper surface of the uppermost second channel layer 143B. The first conductive material layers 163$p$ and 163$n$ may be formed in the opening OP to have an initial thickness t1' in the Z direction.

In this operation, for example, since the first gate dielectric layer 161 and the first conductive material layer 163$p$ may be conformally formed in the opening OP of the first region R1, a first width W1 of a region in which the opening OP is exposed in the X direction may be equal to a value in which a sum of about twice a thickness of the first gate dielectric layer 161 and about twice the initial thickness t1' of the first conductive material layer 163$p$ is subtracted from the gate opening width Wg.

Figure 11A:
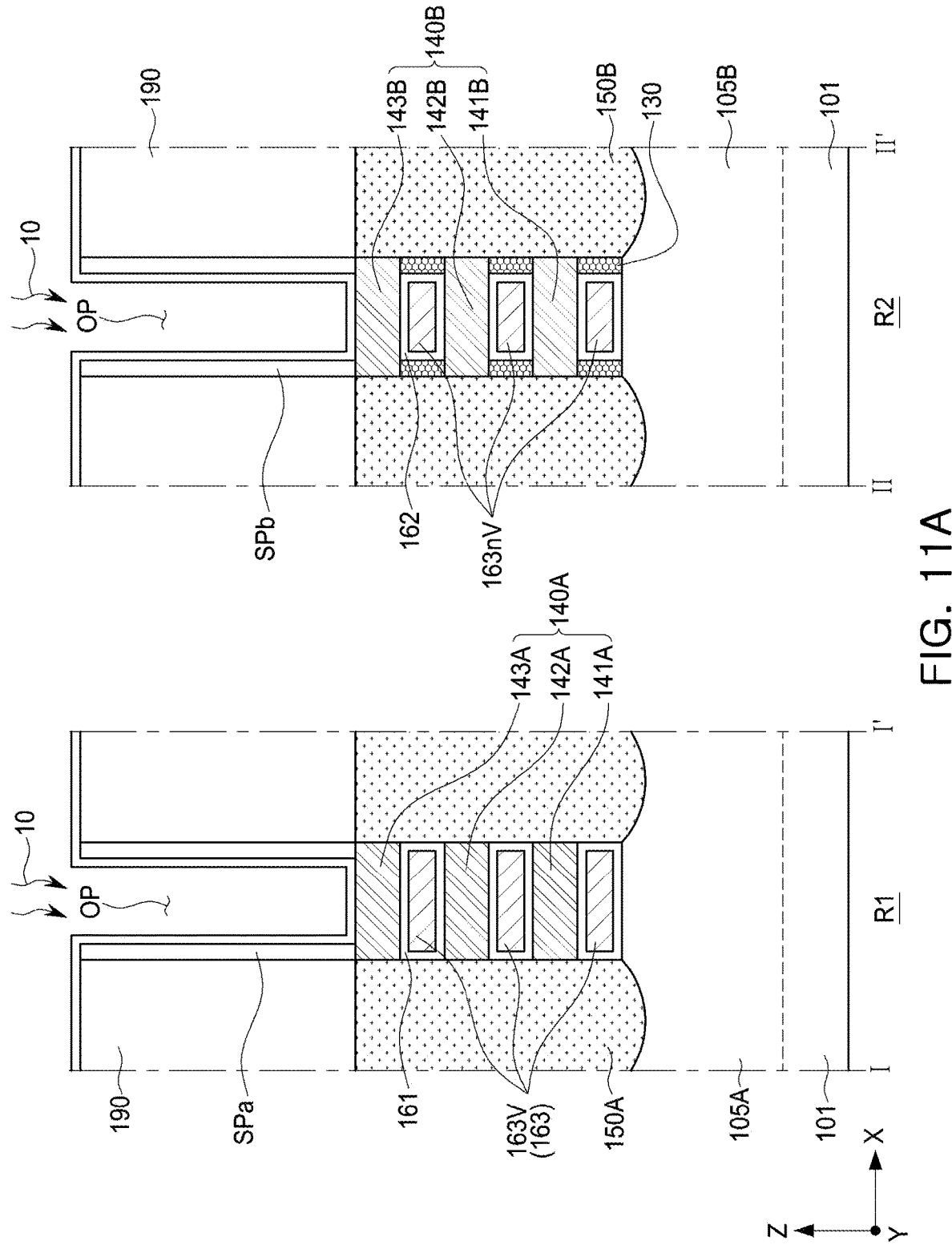
Figure 11B:
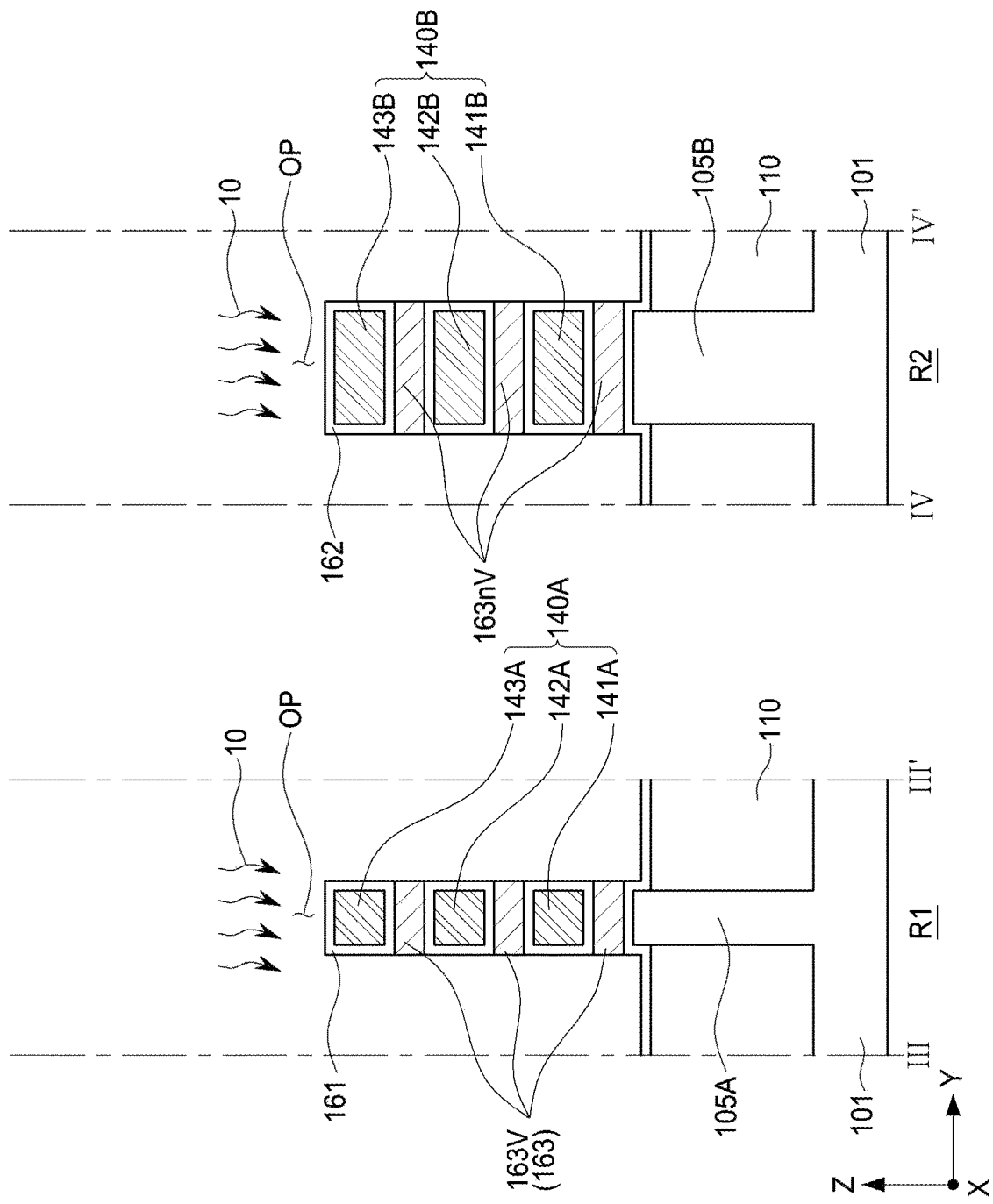

Referring to FIGS. 6B, 11A, and 11B, the first conductive material layers 163$p$ and 163$n$ are partially removed from upper portions thereof (S62).

The first conductive material layers 163$n$ and 163$p$ may be selectively removed in a predetermined thickness with respect to the gate dielectric layers 161 and 162. A portion of the first conductive material layers 163n and 163p may be removed by performing an etching process 10. The etching process 10 may use, for example, at least one of a wet etching process and a dry etching process. In the etching process 10, an etchant including, for example, hydrogen peroxide ($H_2O_2$) may be used. The first conductive material layer 163p of the first region R1 may remain as inner portions 163V in a space between the first channel layers 141A, 142A, and 143A and in a space between the lowermost first channel layer 141A and the first active fin 105A. The first conductive material layer 163n of the second region R2 may remain as inner portions 163nV in a space between the second channel layers 141B, 142B, and 143B and in a space between the lowermost second channel layer 141B and the second active fin 105B.

Figure 12A:
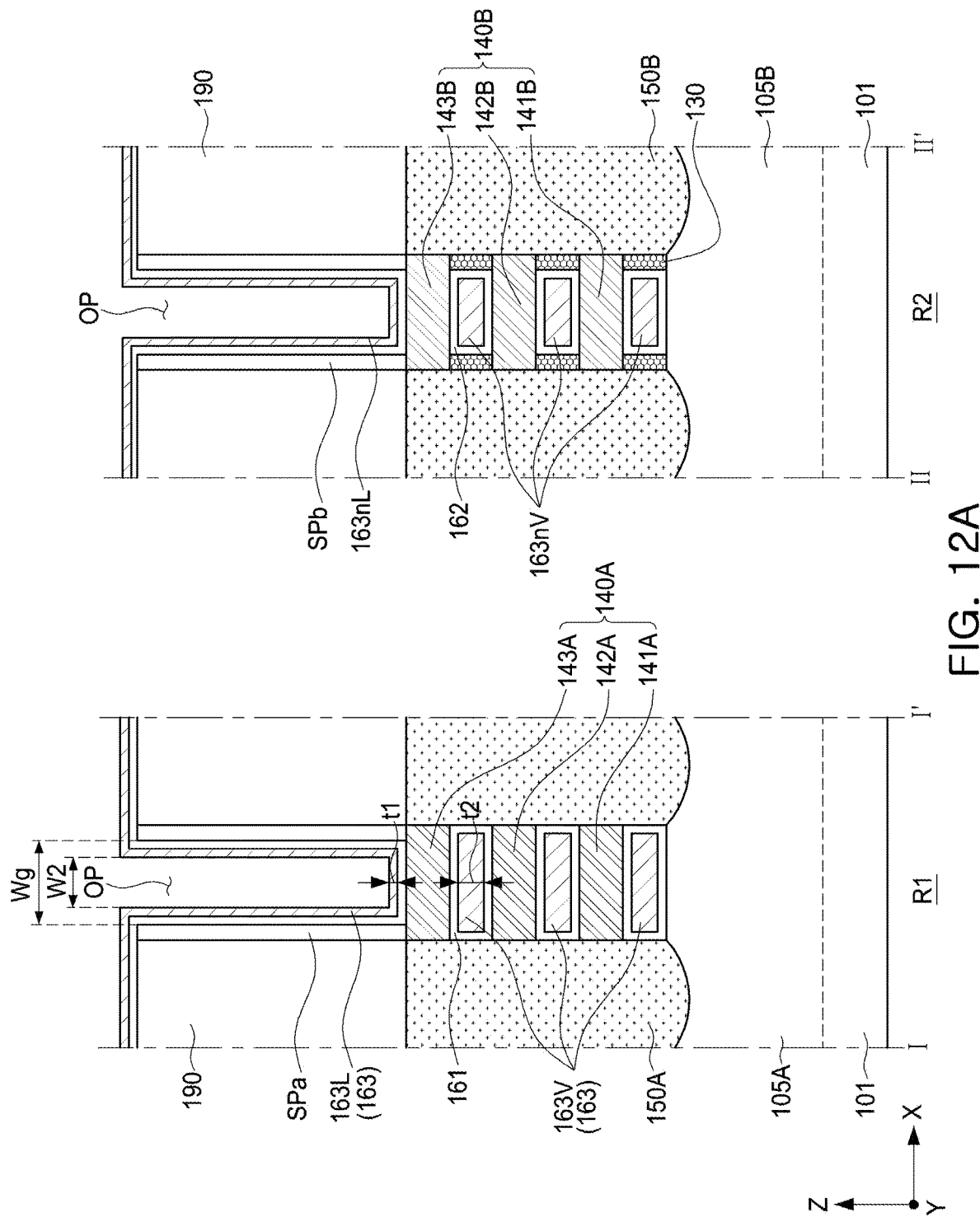
Figure 12B:
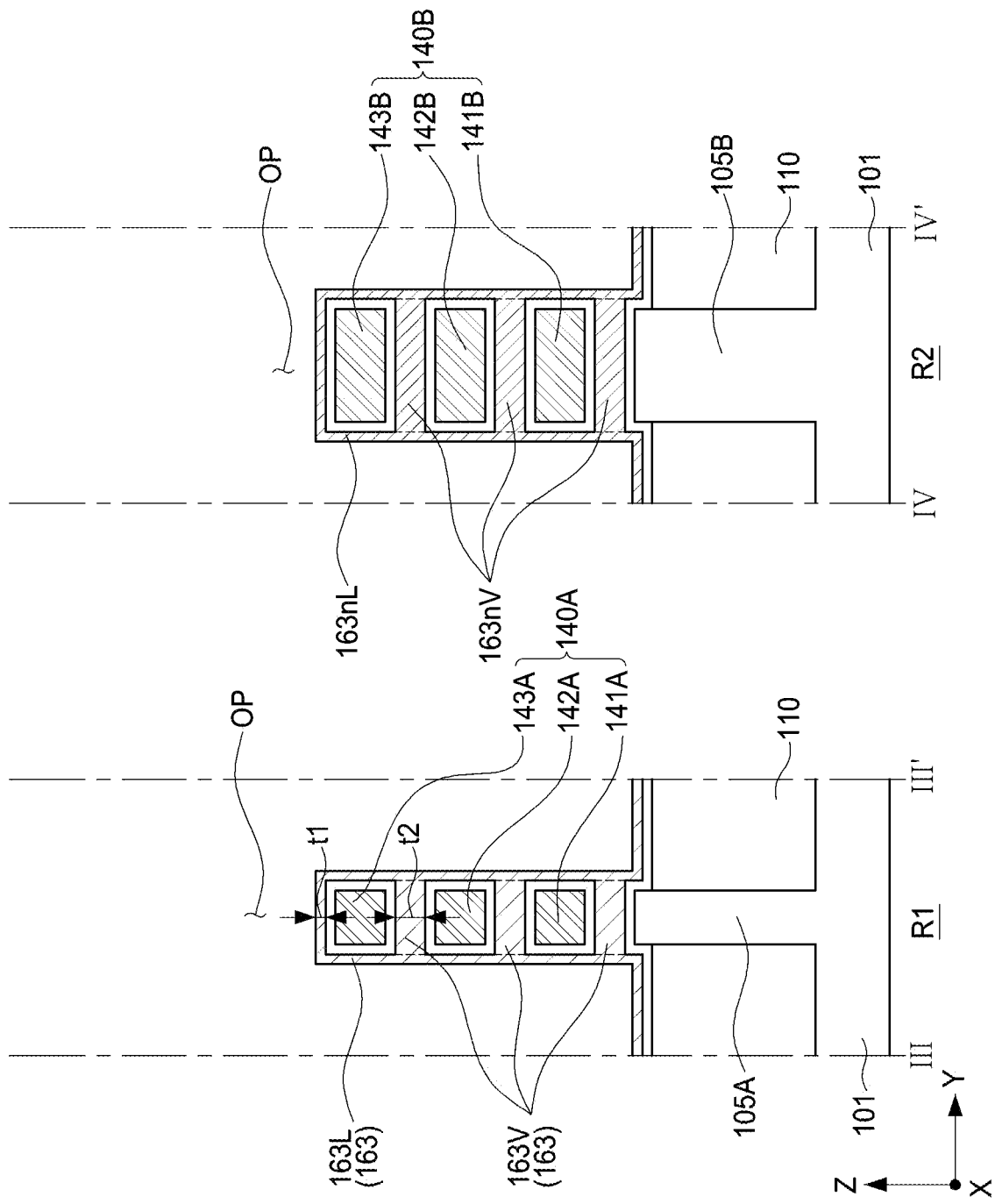

Referring to FIGS. 6B, 12A, and 12B, conductive liners 163L and 163nL having a thickness less than that of the first conductive material layers 163p and 163n, are formed (S63).

The conductive liners 163L and 163nL may be formed in the opening OP to have a thickness t1 that is less than the initial thickness t1' of the first conductive material layers 163p and 163n when formed. For example, the conductive liners 163L and 163nL may be formed in the opening OP to cover the gate dielectric layers 161 and 162 and as having the uniform thickness t1.

In this operation, for example, since the conductive liners 163L and 163nL may be formed in the opening OP to have the thickness t1 less than a thickness when the first conductive material layers 163p and 163n are formed, a second width W2 of an exposed region in the X direction may be greater than the previous first width W1. Therefore, since the second width W2 of the exposed region of the opening OP may be secured relatively larger, various defects caused by a blocking pattern or a conductive material layer not completely filling the opening OP in a subsequent process may be prevented.

Figure 13A:
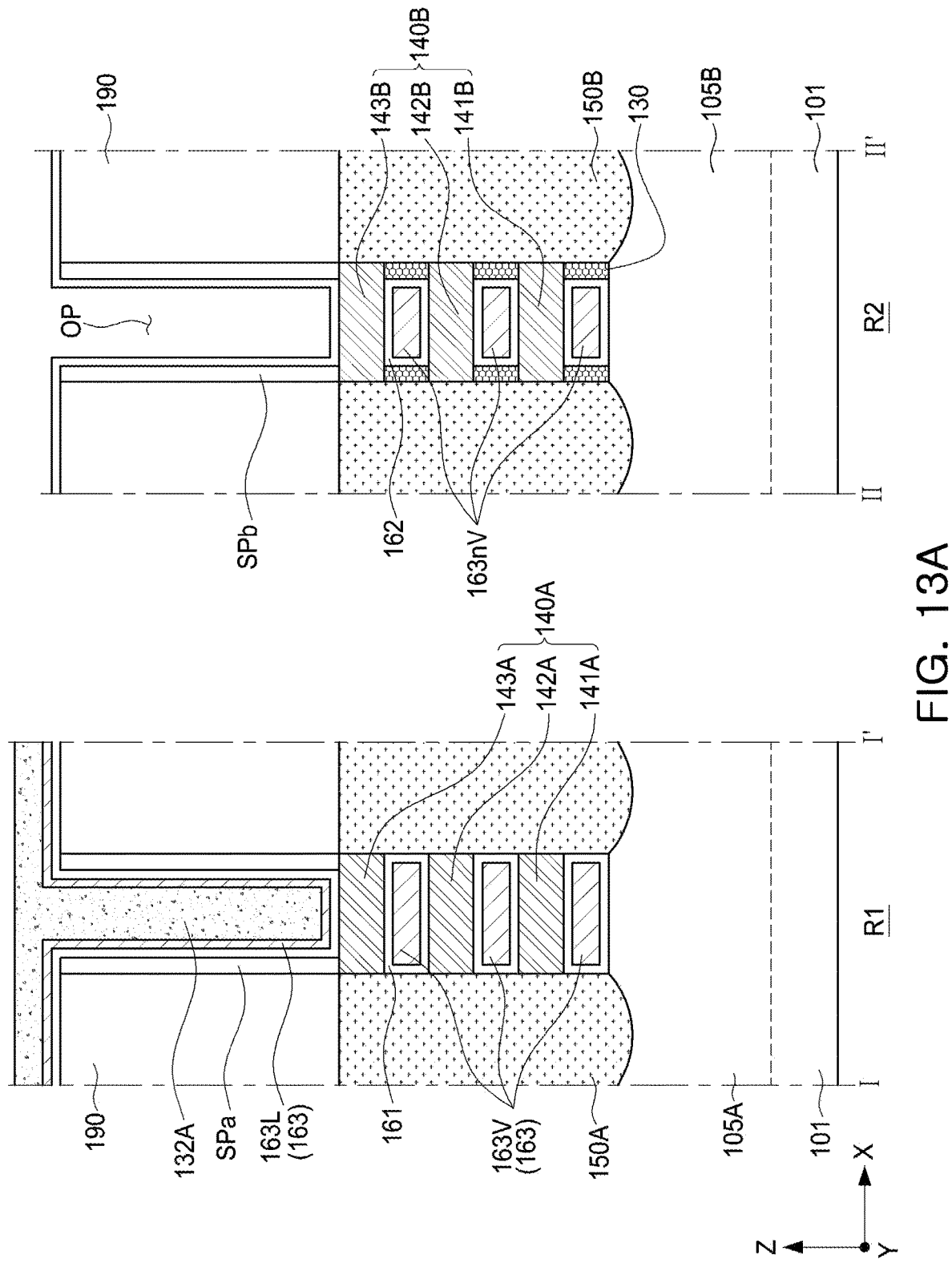
Figure 13B:
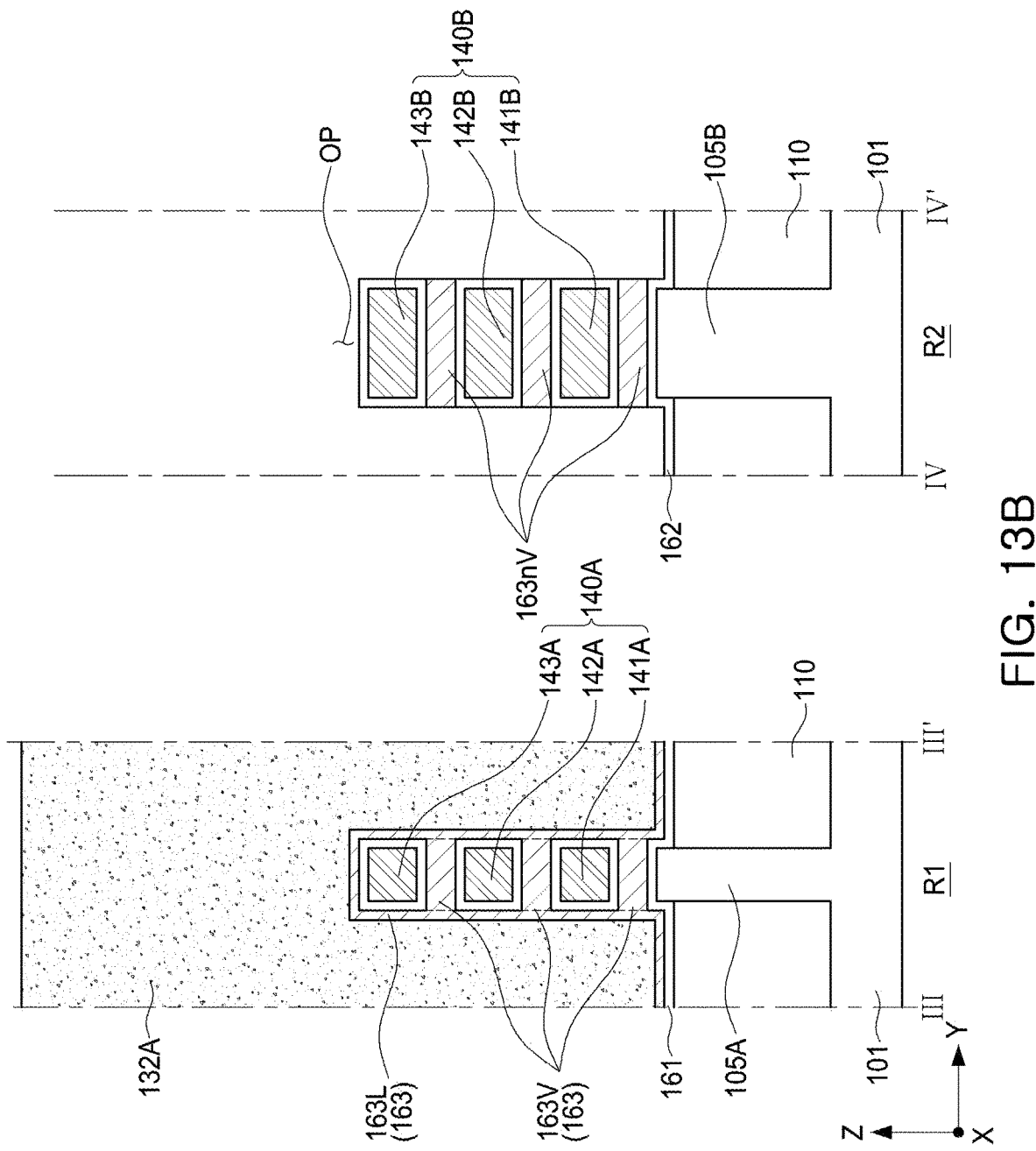

Referring to FIGS. 6B, 13A, and 13B, a first blocking pattern 132A is formed in the first region R1 (S64), and a portion (163nL) of the conductive liners 163L and 163nL in the second region R2 is removed (S65).

The first blocking pattern 132A may be formed in the first region R1 to cover the first conductive layer 163 and fill the opening OP. The first blocking pattern 132A may be partially formed to extend onto the interlayer insulating layer 190. The first blocking pattern 132A may be formed for example as a single layer structure of at least one of a bottom anti-reflective coating (BARC), an amorphous carbon layer (ACL), a spin on hardmask (SOH), a spin on carbon (SOC), or a silicon nitride layer, or as a multilayer structure. In the second region R2, the first blocking pattern 132A is not formed, and the opening OP remains exposed. The first blocking pattern 132A may be protected by capping the first region R1.

In the second region R2, a portion (163nL) of the conductive liners 163L and 163nL may be selectively removed with respect to the second gate dielectric layer 162 and the first blocking pattern 132A. The inner portions 163nV of the first conductive material layer 163n of the second region R2 may remain still in the space between the second channel layers 141B, 142B, and 143B and in the space between the lowermost second channel layer 141B and the second active fin 105B.

A region having a relatively small gate opening width Wg may exist between the first region R1 and the second region R2. In this case, if the first blocking pattern 132A does not completely fill the opening OP in the first region R1 or at a boundary between the first and second regions R1 and R2, a void may be formed in the first blocking pattern 132A. When the void is formed in the first blocking pattern, during a subsequent process of removing a portion of the first conductive material layer in the second region R2, the first conductive material layer may be also removed from the first region R1, which may cause device failure. According to embodiments of the inventive concepts, because the second width W2 of the exposed region of the opening OP may be secured relatively larger than the first width W1, the first blocking pattern 132A may be stably formed in the first region R1 or in an interface region between the first and second regions R1 and R2 without a void, and the first conductive material layer of the first region R1 may be stably protected, thereby preventing device failure.

Figure 14A:
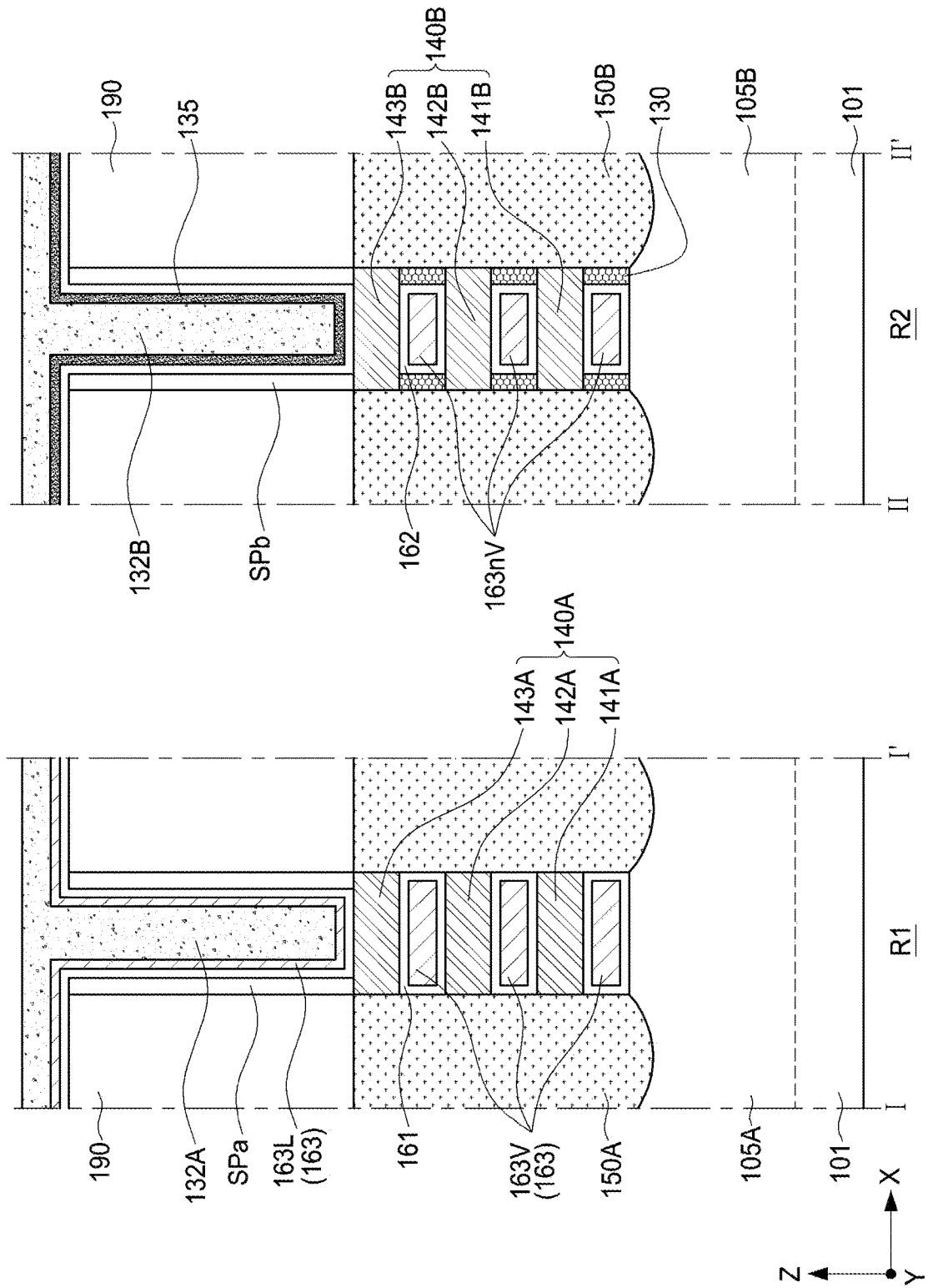
Figure 14B:
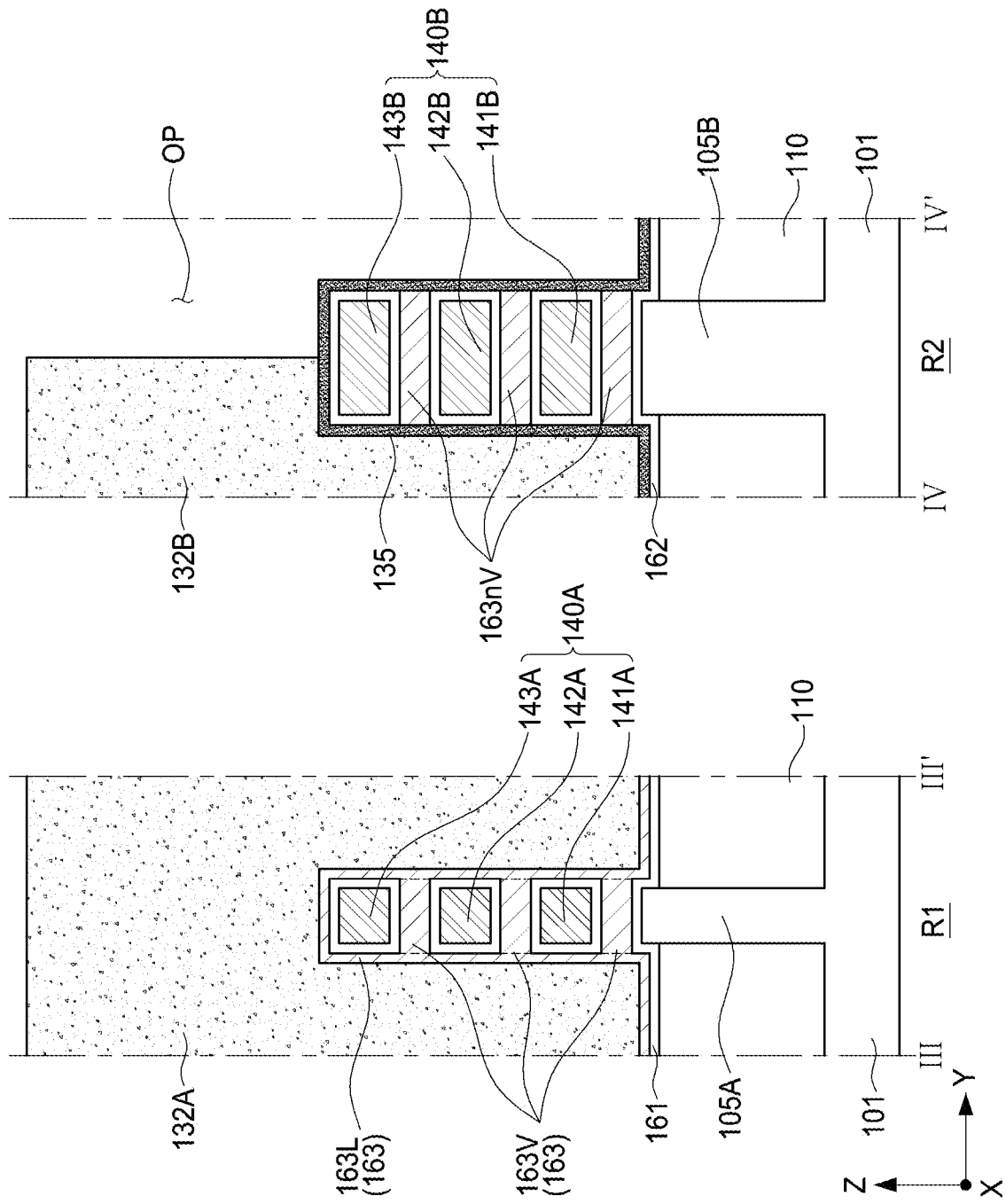

Referring to FIGS. 6B, 14A, and 14B, a barrier liner 135 and a second blocking pattern 132B covering a portion of the barrier liner 135 are formed in the second region R2 (S66).

The barrier liner 135 may be conformally formed in the opening OP in the second region R2, and may cover side surfaces of the second gate dielectric layer 162 and the inner portions 163nV. The barrier liner 135 may for example include at least one of aluminum oxide, aluminum nitride, aluminum oxycarbide, silicon oxide, silicon nitride, silicon oxynitride, or titanium nitride. The second blocking pattern 132B may cover only a portion of the barrier liner 135 so as to a side surface on an upper surface of the second active fin 105B. Therefore, the barrier liner 135 that is not covered by the second blocking pattern 132B may be exposed through the opening OP. The barrier liner 135 and the second blocking pattern 132B may also be formed in the first region R1 to cover the first blocking pattern 132A.

Figure 15A:
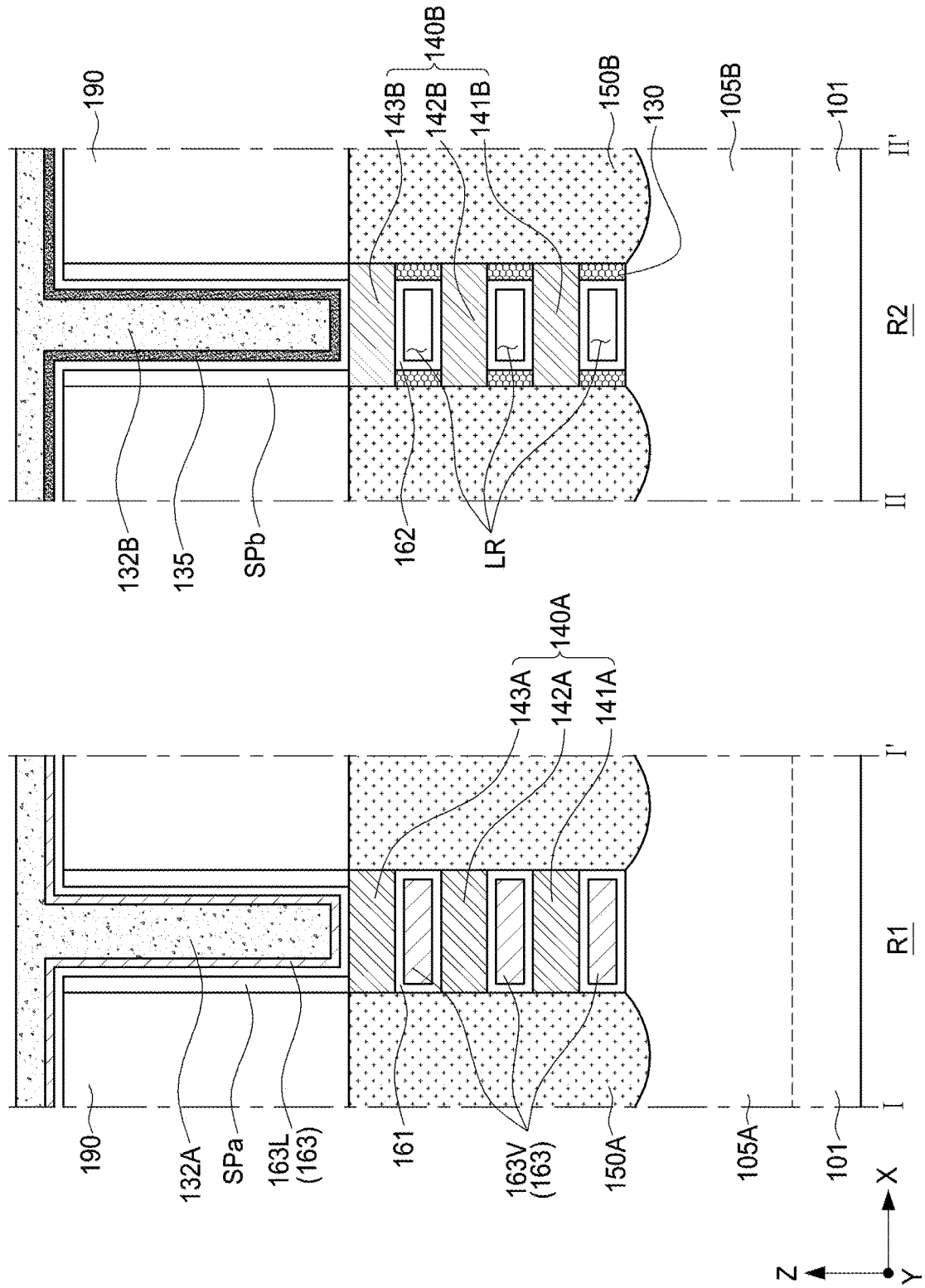
Figure 15B:
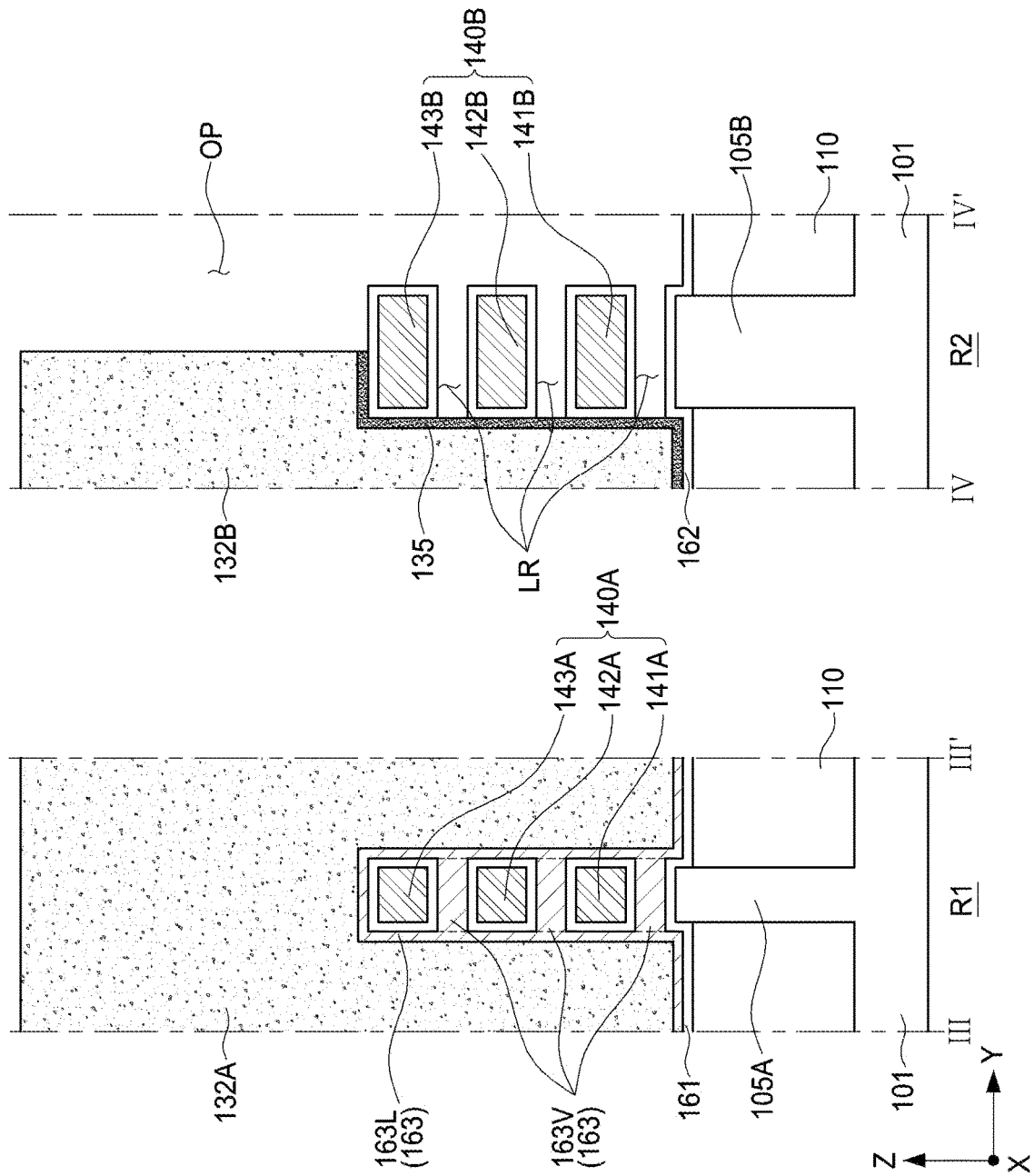

Referring to FIGS. 6B, 15A, and 15B, a portion of the barrier liner 135 exposed in the second region R2, and the inner portions 163nV (a portion of the first conductive material layer 163n) are removed (S67).

First, a portion of the barrier liner 135 not covered by the second blocking pattern 132B may be removed in the second region R2 to expose side surfaces of the inner portions 163nV of the first conductive material layer 163n. Next, the inner portions 163nV of the first conductive material layer 163n may be removed from the side surfaces. The barrier liner 135 and the second blocking pattern 132B may block an etchant from flowing into the first region R1 from the interface region between the first region R1 and the second region R2.

Figure 16A:
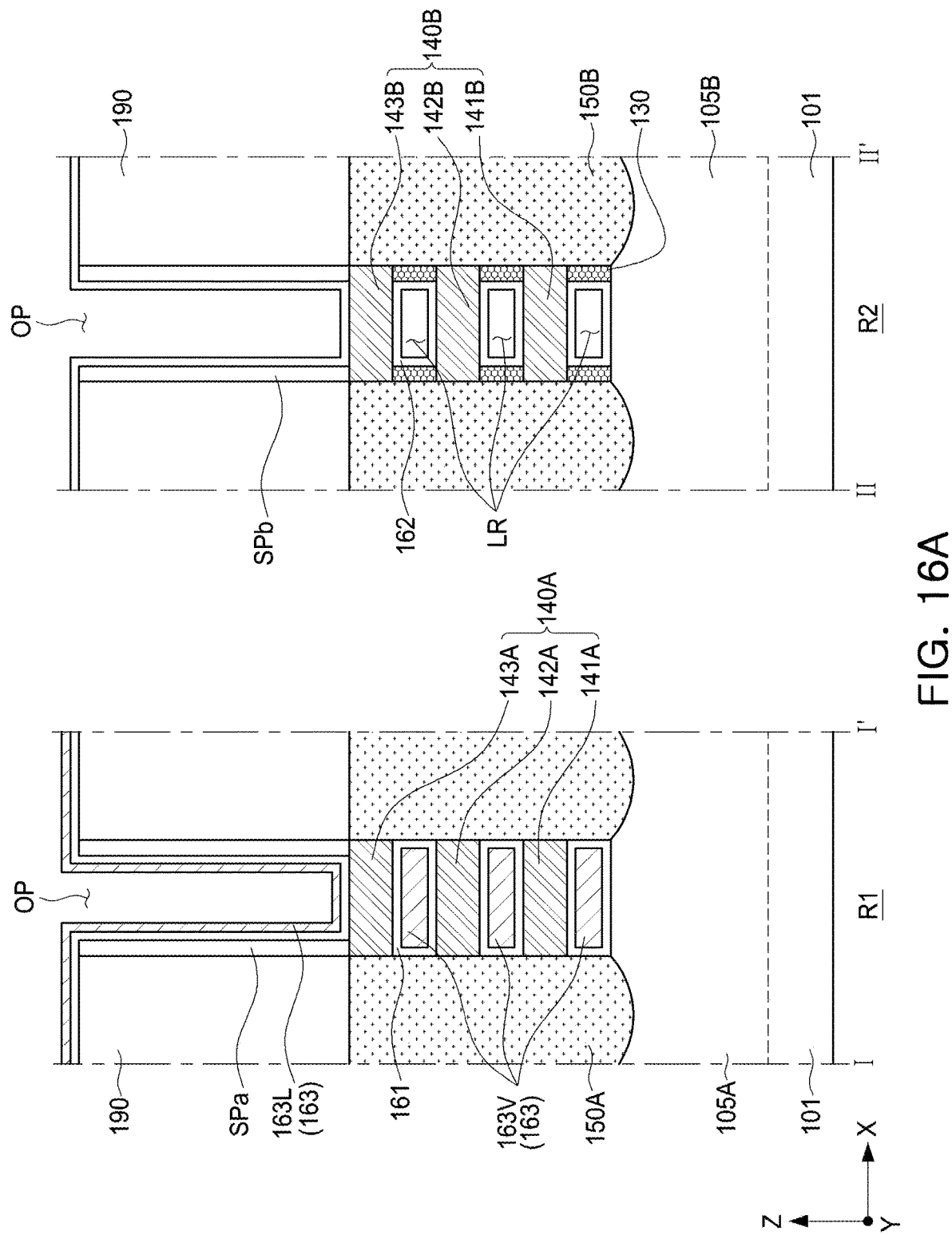
Figure 16B:
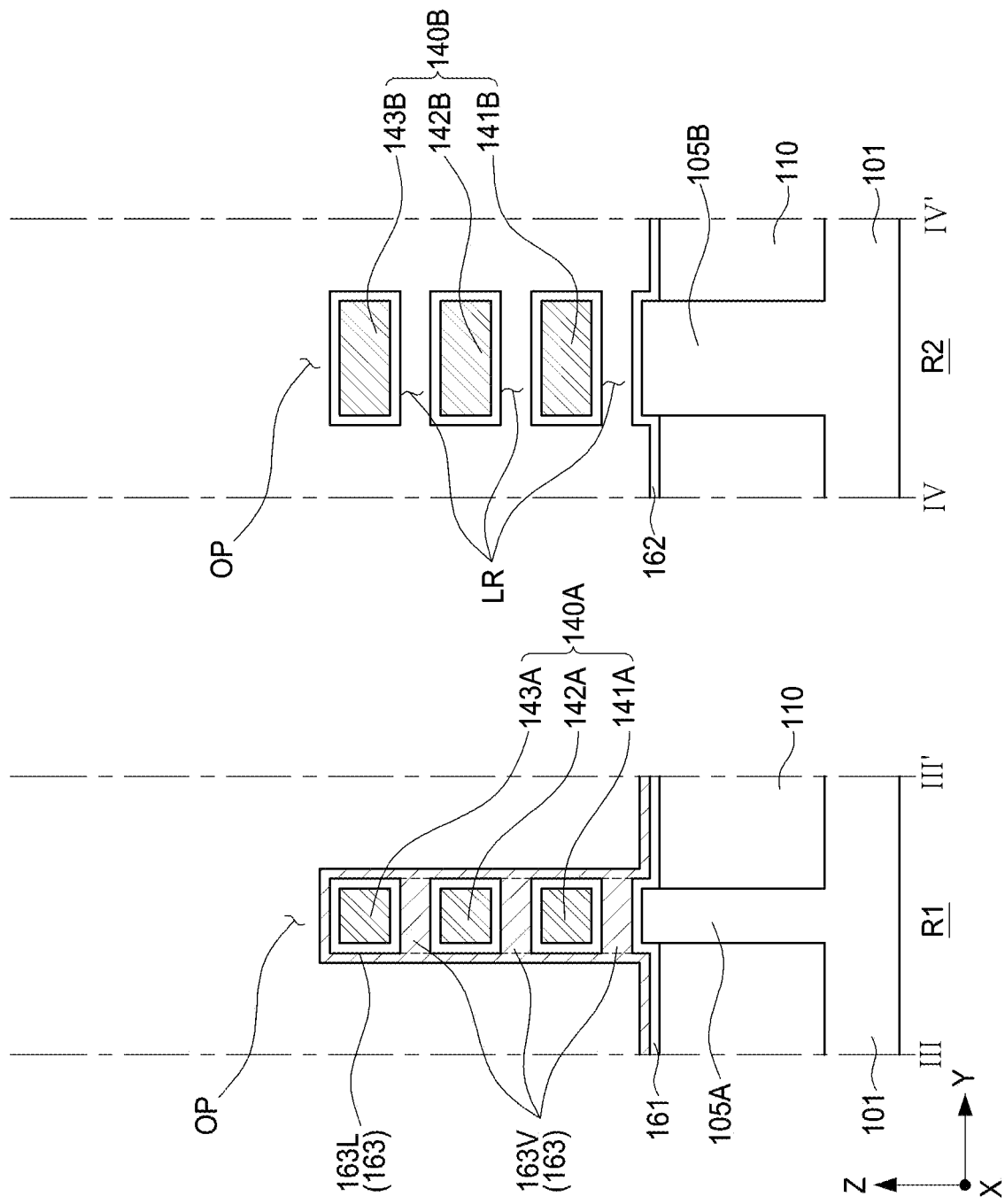

Referring to FIGS. 6B, 16A, and 16B, the first blocking pattern 132A, the second blocking pattern 132B, and the barrier liner 135 are removed (S68).

The first blocking pattern 132A may be removed in the first region R1 to expose the opening OP, and the conductive liner 163L may be exposed to the opening OP. The second blocking pattern 132B and the barrier liner 135 may be removed in the second region R2 to expose the opening OP, and a gap region LR may be exposed between the second active fin 105B and the second channel structure 140B.

Figure 17A:
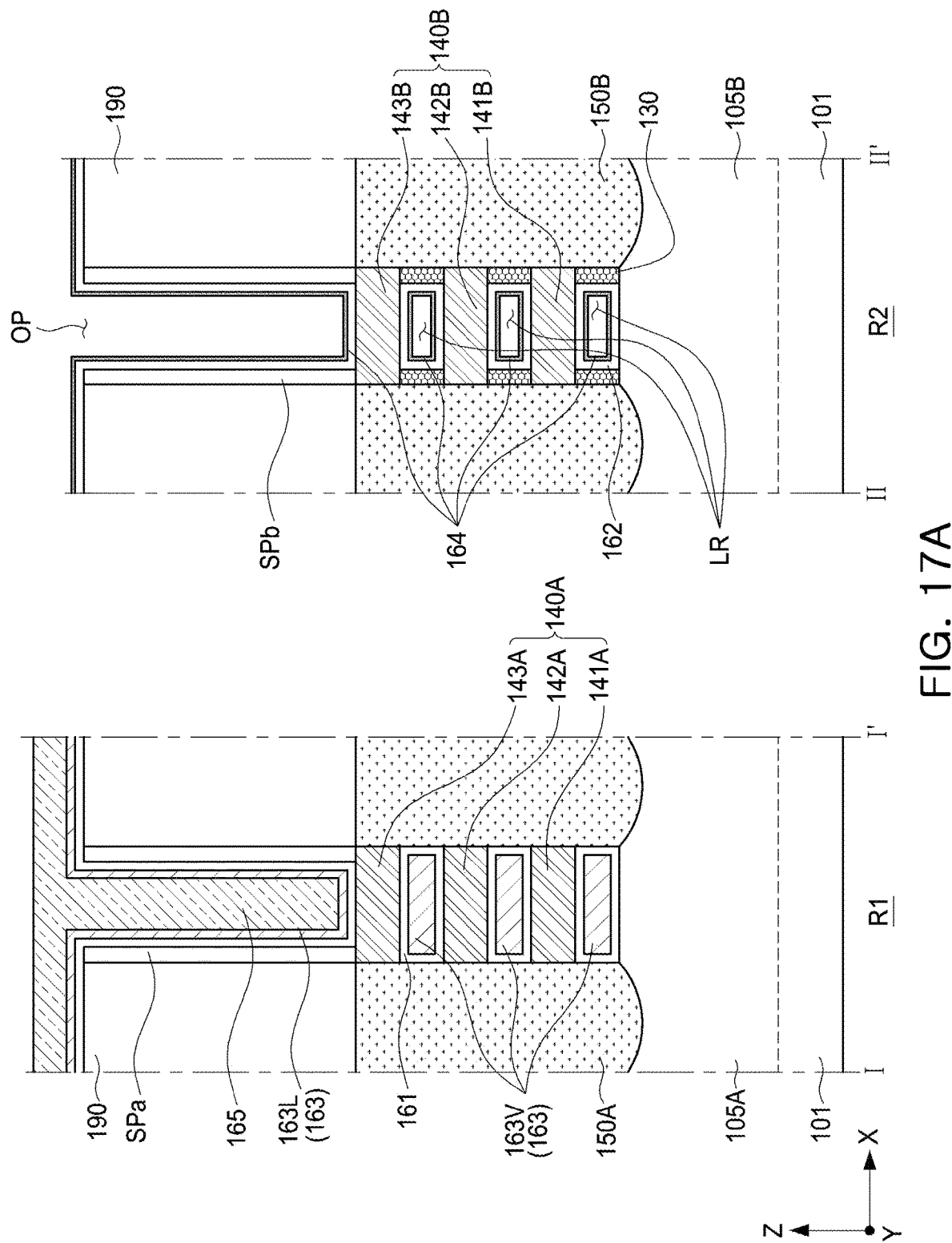
Figure 17B:
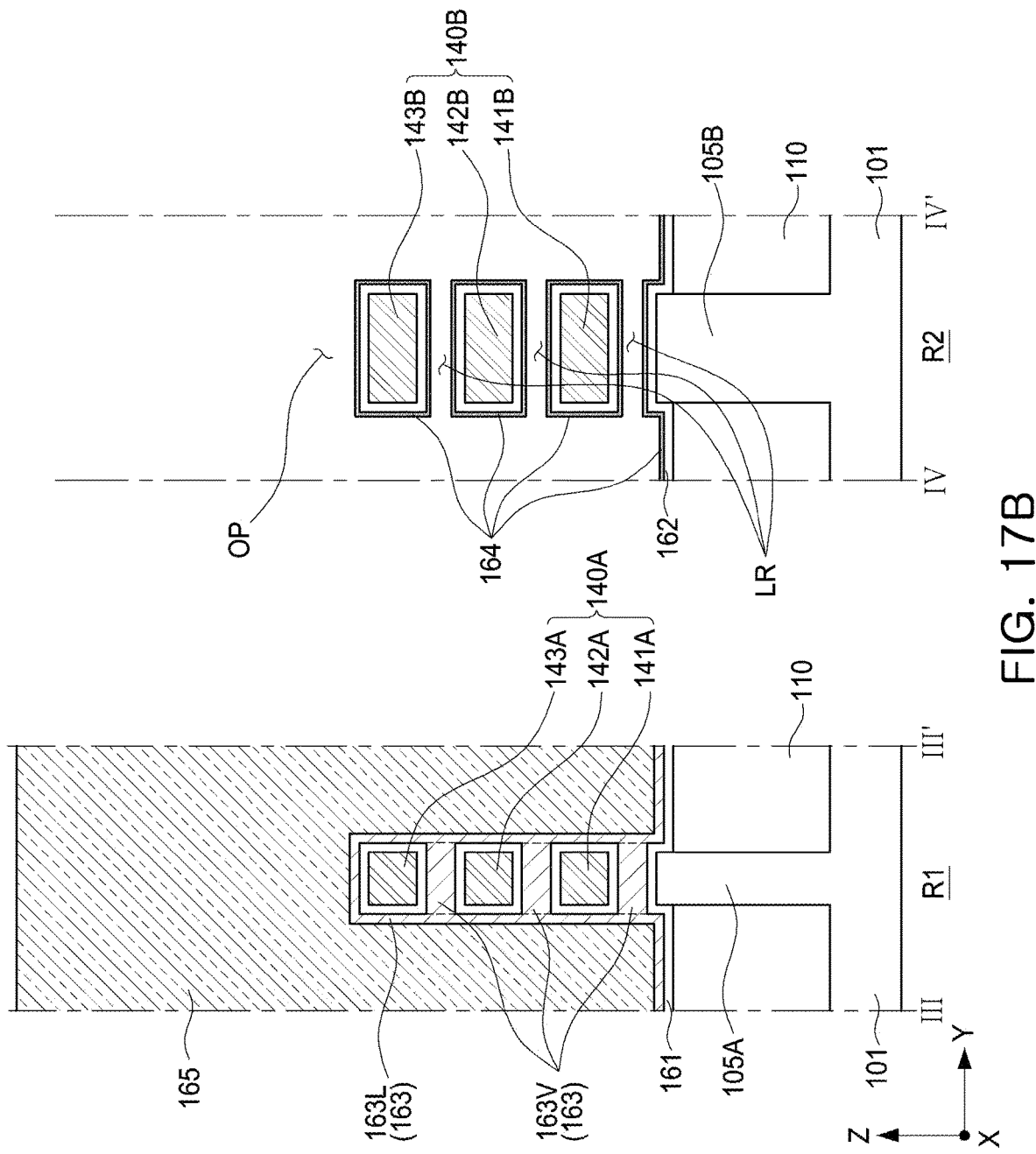
Figure 18A:
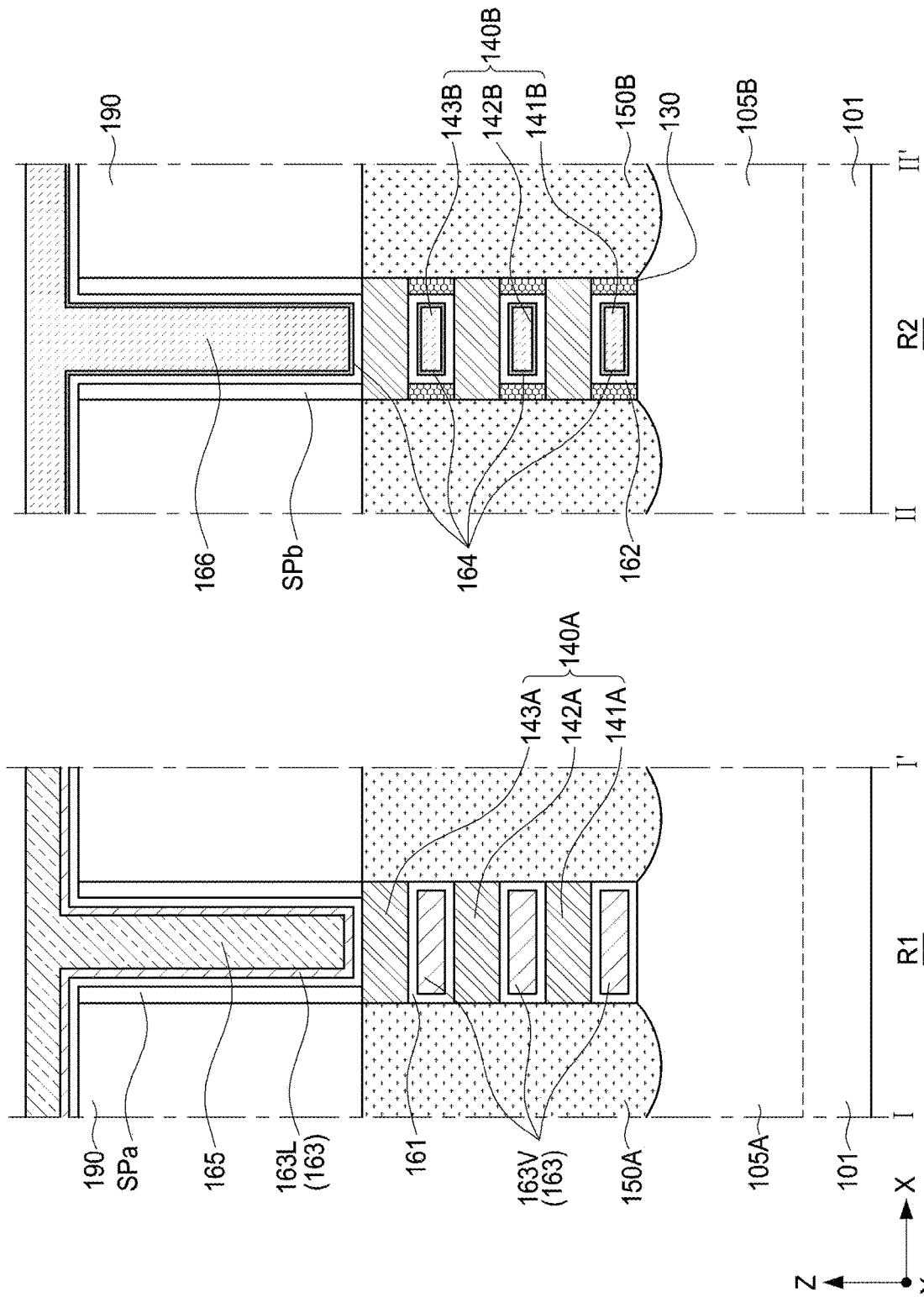
Figure 18B:
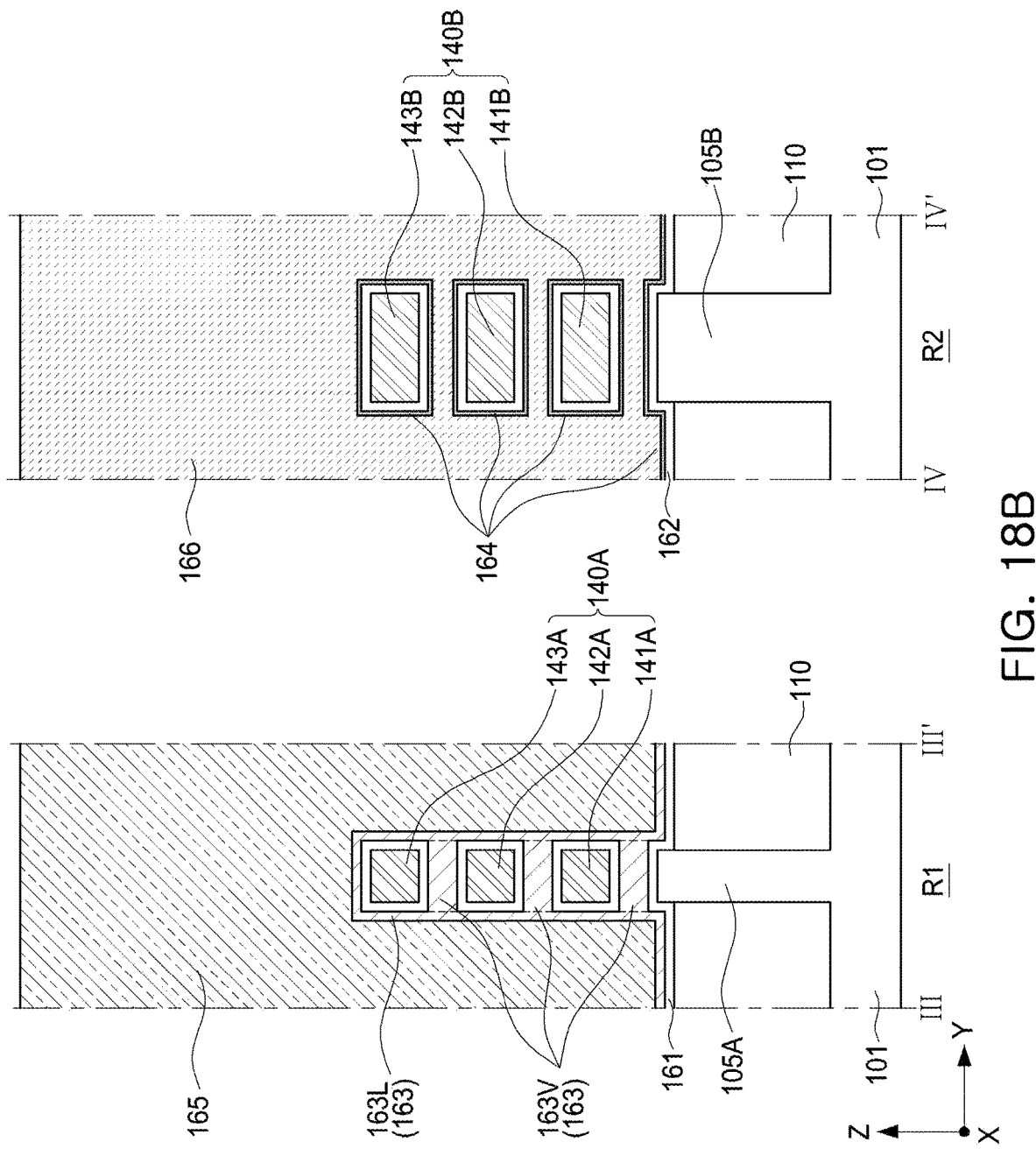

Referring to FIGS. 6B, 17A, and 17B, a second conductive material layer 165 is formed in the first region R1, and a third conductive material layer 164 is formed in the second region R2. Referring to FIGS. 6B, 18A, and 18B, a fourth conductive material layer 166 is formed in the second region R2 (S69).

The second conductive material layer 165 may be formed to fill the opening OP in the first region RE The second conductive material layer 165 may cover the first conductive material layer 163. The third conductive material layer 164 covering the second gate dielectric layer 162 in the opening OP and the gap regions LR in the second region R2 may be conformally formed. The third conductive material layer 164 does not completely fill the opening OP and the gap regions LR of the second region R2. The second conductive material layer 165 and the third conductive material layer 164 may be formed in each of the first region R1 and the second region R2 by separate processes. The fourth conductive material layer 166 may be formed to fill the opening OP and the gap regions LR in the second region R2. The fourth conductive material layer 166 may cover the third conductive material layer 164. Thereafter, gate capping layers GCa and GCb may be formed, and a first gate dielectric layer 161, a first gate electrode (163 and 165), a second gate dielectric layer 162, and a second gate electrode (164 and 166) may be formed.

Figure 19:
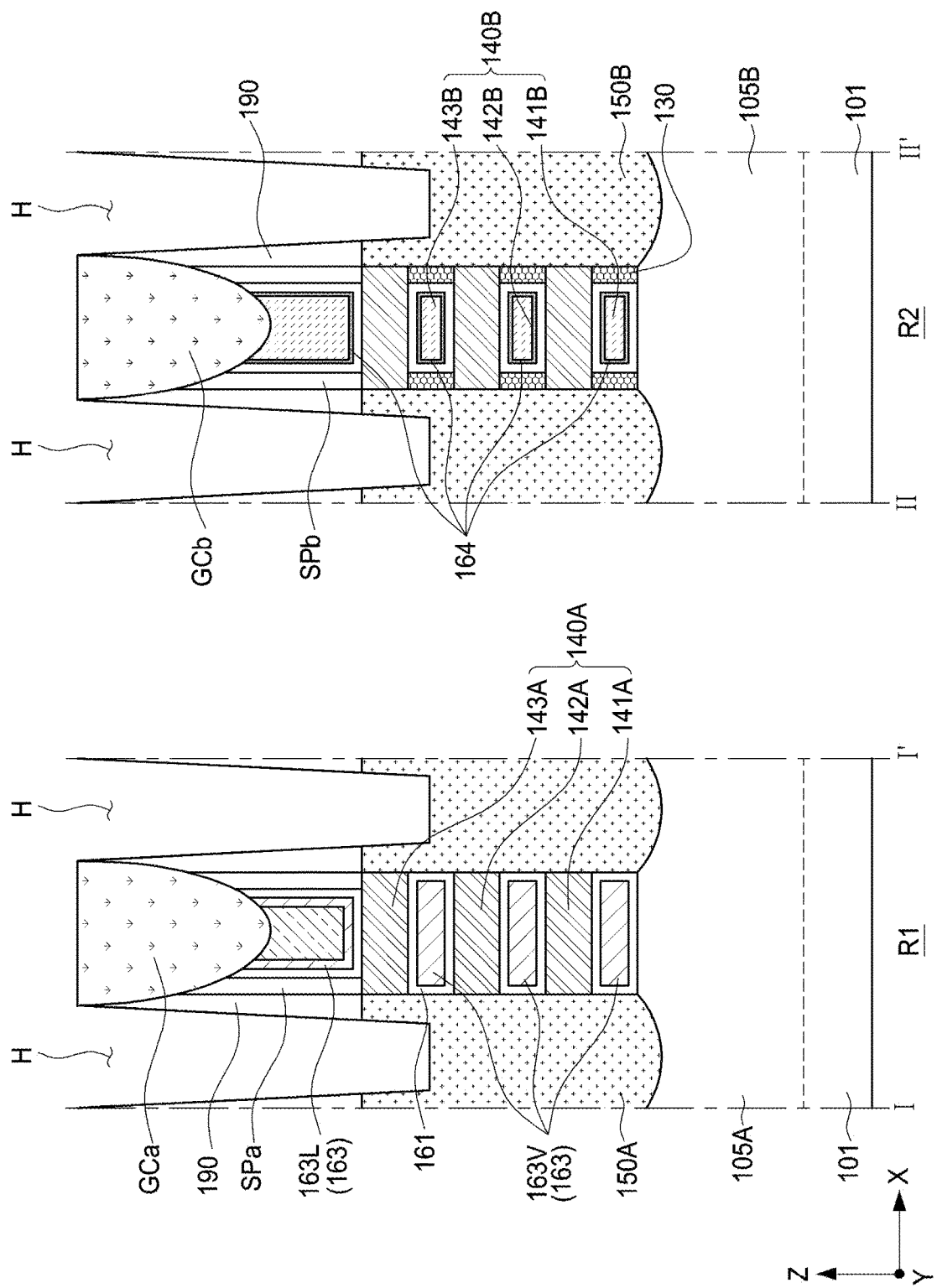

Referring to FIGS. 6A and 19, the gate capping layers GCa and GCb and the contact structure 180 are formed (S70).

The interlayer insulating layer 190 may be patterned to form contact holes H. The bottom of the contact holes H may be partially recessed into the source/drain regions 150A and 150B. In other embodiments, the contact holes H may not be recessed into the source/drain regions 150A and 150B, and may be formed to be in contact with upper surfaces of the source/drain regions 150A and 150B. Referring to FIGS. 1 to 2B together, a barrier layer 184 and a plug layer 186 may be formed by filling a conductive material in the contact holes H. Before forming the barrier layer 184 and the plug layer 186, a metal-semiconductor compound layer 182 may be formed in the source/drain regions 150A and 150B exposed through the contact holes H. Therefore, the semiconductor device 100 of FIGS. 1 to 2B may be manufactured.

By controlling a thickness of a conductive layer of a gate electrode at a level on an upper surface of an uppermost channel layer, a semiconductor device having improved electrical characteristics and reliability may be provided.

Various advantages and effects of the inventive concepts should not be limited to the above description. While example embodiments have been illustrated and described, it should be apparent to those skilled in the art that modifications and variations can be made without departing from the scope of the inventive concepts as defined by the appended claims.

What is claimed is:

1. A semiconductor device comprising:
a substrate having a first region and a second region;
a first active fin extending in a first direction in the first region of the substrate;
a plurality of first channel layers disposed on the first active fin and spaced apart from each other in a vertical direction that is perpendicular to an upper surface of the substrate;
a first gate pattern intersecting the first active fin and the plurality of first channel layers on the substrate, extending in a second direction, and surrounding at least a portion of the plurality of first channel layers;
a second active fin extending in the first direction in the second region of the substrate;
a plurality of second channel layers disposed on the second active fin and spaced apart from each other in the vertical direction; and
a second gate pattern intersecting the second active fin and the plurality of second channel layers on the substrate, extending in the second direction, and surrounding at least a portion of the plurality of second channel layers, wherein the first gate pattern comprises a first conductive layer, a first gate dielectric layer interposed between the first conductive layer and each of the plurality of first channel layers, and a second conductive layer on the first conductive layer,
wherein the first conductive layer and the first gate dielectric layer are disposed to fill spaces between the plurality of first channel layers,
wherein the first conductive layer comprises a liner portion disposed on an upper surface of an uppermost first channel layer from among the plurality of first channel layers and that has a first thickness in the vertical direction, and an inner portion disposed in the spaces between the plurality of first channel layers and that has a second thickness in the vertical direction, and
wherein the first thickness is less than 0.5 times the second thickness, and
wherein the semiconductor device further comprises first spacer layers disposed on both sides of the first gate pattern and extending in the second direction,
wherein the first gate dielectric layer conformally covers the upper surface of the uppermost first channel layer and inner side surfaces of the first spacer layers,
wherein the liner portion of the first conductive layer extends in the vertical direction along inner side surfaces of the first gate dielectric layer covering the inner side surfaces of the first spacer layers, wherein a thickness in the first direction of the liner portion on the inner side surfaces of the first gate dielectric layer is substantially equal to the first thickness, and
wherein the thickness in the first direction of the liner portion is a thickness between the inner side surfaces of the first gate dielectric layer and an interface that is present between the first conductive layer and an adjacent layer.

2. The semiconductor device of claim 1, wherein the first conductive layer is in direct contact with the first gate dielectric layer,
wherein the second conductive layer is spaced apart from the inner portion of the first conductive layer, and
wherein the first thickness is a thickness of the liner portion in a central portion of the first gate pattern, and the second thickness is a thickness of the inner portion in the central portion of the first gate pattern.

3. The semiconductor device of claim 1, wherein the liner portion of the first conductive layer extends below opposite side surfaces of the uppermost first channel layer in the second direction with a thickness in the second direction that is substantially equal to the first thickness.

4. The semiconductor device of claim 1, wherein the second gate pattern comprises a third conductive layer, a second gate dielectric layer interposed between the third conductive layer and each of the plurality of second channel layers, and a fourth conductive layer on the third conductive layer,
wherein the third conductive layer, the fourth conductive layer, and the second gate dielectric layer are disposed to fill spaces between the plurality of second channel layers,
wherein the fourth conductive layer is disposed to surround the third conductive layer, and
wherein the third conductive layer is disposed between an upper surface of an uppermost second channel layer from among the plurality of second channel layers and a lower surface of the fourth conductive layer, at a higher level than the uppermost second channel layer, and the third conductive layer has a third thickness in the vertical direction that is less than the first thickness.

5. The semiconductor device of claim 4, wherein the second thickness is greater than twice a difference between the first thickness and the third thickness.

6. The semiconductor device of claim 4, wherein the first conductive layer, the second conductive layer, and the third conductive layer respectively comprise TiN, and the fourth conductive layer comprises TiAlC.

7. The semiconductor device of claim 1, further comprising:
first source/drain regions disposed on the first active fin on both sides of the first gate pattern and connected to the plurality of first channel layers; and
second source/drain regions disposed on the second active fin on both sides of the second gate pattern and connected to the plurality of second channel layers,
wherein the first source/drain regions comprise a p-type impurity, and the second source/drain regions comprise an n-type impurity.

8. The semiconductor device of claim 7, further comprising internal spacer layers disposed between the second source/drain regions and the second gate pattern in spaces between the plurality of second channel layers.

9. The semiconductor device of claim 7, further comprising:
first contact structures connected to the first source/drain regions on the both sides of the first gate pattern; and
second contact structures connected to the second source/drain regions on the both sides of the second gate pattern.

10. The semiconductor device of claim 1, wherein a width of at least one of the plurality of first channel layers in the second direction is different from a width of at least one of the plurality of second channel layers in the second direction.

11. A semiconductor device comprising:
an active fin protruding from a substrate and extending in a first direction;
a plurality of channel layers disposed on the active fin and spaced apart from each other in a vertical direction that is perpendicular to an upper surface of the substrate;
a gate pattern intersecting the active fin and the plurality of channel layers on the substrate and extending in a second direction; and
source/drain regions disposed on recessed regions of the active fin on both sides of the gate pattern and connected to the plurality of channel layers,
wherein the gate pattern comprises a gate dielectric layer, inner conductive layers, and a conductive liner,
wherein the inner conductive layers are disposed between the plurality of channel layers, and between the active fin and a lowermost channel layer from among the plurality of channel layers,
wherein the gate dielectric layer is disposed between each of the inner conductive layers and each of the plurality of channel layers,
wherein the inner conductive layers and the conductive liner are in direct contact with the gate dielectric layer,
wherein the conductive liner extends from the inner conductive layers onto opposite side surfaces of the plurality of channel layers in the second direction and onto an upper surface of an uppermost channel layer, among the plurality of channel layers,
wherein the conductive liner has a first thickness on the upper surface of the uppermost channel layer in the vertical direction,
wherein at least one of the inner conductive layers has a second thickness in the vertical direction,
wherein the first thickness is less than 0.5 times the second thickness,
wherein the conductive liner extends in the vertical direction along inner side surfaces of the gate dielectric layer above the uppermost channel layer, to define a recess,
wherein a thickness of the conductive liner, in the first direction, along the inner side surfaces of the gate dielectric layer above the uppermost channel layer, is substantially equal to the first thickness, and
wherein the thickness in the first direction of the conductive liner is a thickness between the inner side surfaces of the gate dielectric layer above the uppermost channel layer and an interface that is present between the conductive liner and an adjacent layer.

12. The semiconductor device of claim 11, wherein the inner conductive layers and the conductive liner respectively comprise TiN.

13. The semiconductor device of claim 11, wherein the first thickness is less than 3 nm, and the second thickness is equal to or greater than 6 nm.

14. The semiconductor device of claim 11, further comprising spacer layers disposed on both sides of the gate pattern and extending in the second direction,
wherein a portion of the gate dielectric layer conformally covers the upper surface of the uppermost channel layer and inner side surfaces of the spacer layers,
wherein the portion of the gate dielectric layer conformally covering the upper surface of the uppermost channel layer and the inner side surfaces of the spacer layers comprises the inner side surfaces of the gate dielectric layer above the uppermost channel layer.

15. The semiconductor device of claim 11, wherein the gate pattern further comprises a capping conductive layer contacting an upper surface and side surfaces of the conductive liner and including TiN.

16. A semiconductor device comprising:
a substrate having a first region and a second region;
a first transistor disposed on the first region, and including a first active fin extending in a first direction, a plurality of first channel layers on the first active fin, a first gate pattern surrounding at least a portion of the plurality of first channel layers and extending in a second direction, and first source/drain regions disposed on the first active fin on both sides of the first gate pattern; and
a second transistor disposed on the second region, and including a second active fin extending in the first direction, a plurality of second channel layers on the second active fin, a second gate pattern surrounding at least a portion of the plurality of second channel layers and extending in the second direction, and second source/drain regions disposed on the second active fin on both sides of the second gate pattern,
wherein the first transistor and the second transistor are MOSFETs having different respective conductivity types,
wherein the first gate pattern comprises a first conductive layer, a first gate dielectric layer interposed between the first conductive layer and each of the plurality of first channel layers, and a second conductive layer on the first conductive layer, and
wherein the second gate pattern comprises a third conductive layer, a second gate dielectric layer interposed between the third conductive layer and each of the plurality of second channel layers, and a fourth conductive layer on the third conductive layer, wherein the first conductive layer and the first gate dielectric layer are disposed to fill spaces between the plurality of first channel layers, wherein the third conductive layer, the fourth conductive layer, and the second gate dielectric layer are disposed to fill spaces between the plurality of second channel layers, and wherein the first conductive layer comprises a liner portion disposed on an upper surface of an uppermost first channel layer from among the plurality of first channel layers and that has a first thickness in a vertical direction that is perpendicular to an upper surface of the substrate, and an inner portion disposed in the spaces between the plurality of first channel layers and that has a second thickness in the vertical direction, wherein the first thickness is less than 0.5 times the second thickness, wherein the liner portion of the first conductive layer extends in the vertical direction along inner side surfaces of the first gate dielectric layer, wherein a thickness in the first direction of the liner portion on the inner side surfaces of the first gate dielectric layer is substantially equal to the first thickness, and wherein the thickness in the first direction of the liner portion is a thickness between the inner side surfaces of the first gate dielectric layer and an interface that is present between the first conductive layer and an adjacent layer, wherein the third conductive layer is disposed between an upper surface of an uppermost second channel layer from among the plurality of second channel layers and a lower surface of the fourth conductive layer, at a higher level than the uppermost second channel layer, wherein the third conductive layer defines a recess in which the fourth conductive layer is arranged, and wherein an interface is present between the third conductive layer and the fourth conductive layer.

17. The semiconductor device of claim 16, wherein the third conductive layer has a third thickness in the vertical direction, and wherein the second thickness is greater than twice a difference between the first thickness and the third thickness.

18. The semiconductor device of claim 16, wherein a separation distance between the plurality of first channel layers in the vertical direction is substantially equal to a separation distance between the plurality of second channel layers in the vertical direction.

* * * * *